(12) United States Patent
Han

(10) Patent No.: US 12,720,733 B2
(45) Date of Patent: Aug. 25, 2026

(54) SEMICONDUCTOR STRUCTURE, ITS READ/WRITE CONTROLLING AND METHOD OF MAKING THE SAME

(71) Applicant: ChangXin Memory Technologies, Inc., Hefei City (CN)

(72) Inventor: Qinghua Han, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 426 days.

(21) Appl. No.: 18/547,738

(22) PCT Filed: Oct. 11, 2022

(86) PCT No.: PCT/CN2022/124679
§ 371 (c)(1),
(2) Date: Aug. 24, 2023

(87) PCT Pub. No.: WO2024/065877
PCT Pub. Date: Apr. 4, 2024

(65) Prior Publication Data

US 2025/0081440 A1 Mar. 6, 2025

(30) Foreign Application Priority Data

Sep. 27, 2022 (CN) .......................... 202211185511.6

(51) Int. Cl.
*H10B 12/00* (2023.01)
*G11C 11/4096* (2006.01)
(Continued)

(52) U.S. Cl.
CPC .......... *H10B 12/48* (2023.02); *G11C 11/4096* (2013.01); *H10D 30/014* (2025.01); *H10D 30/402* (2025.01); *H10D 64/514* (2025.01)

(58) Field of Classification Search
CPC .... H10B 12/48; H10B 12/00; G11C 11/4096; H10D 30/014; H10D 30/402;
(Continued)

(56) References Cited

U.S. PATENT DOCUMENTS

2023/0413537 A1* 12/2023 Shao .................. H10D 30/6728

FOREIGN PATENT DOCUMENTS

CN 113725301 A 11/2021

OTHER PUBLICATIONS

PCT/CN2022/124679 International Search Report and Written Opinion May 11, 2023.

* cited by examiner

*Primary Examiner* — Mohammad A Rahman
(74) *Attorney, Agent, or Firm* — Syncoda LLC; Feng Ma

(57) ABSTRACT

The disclosed semiconductor structure includes: a substrate and a data line on the substrate, the data line extends along a first direction; the first transistor and the second transistor located on the first transistor's side away from the data line; each of the first transistor and the second transistor includes: a semiconductor column, the semiconductor column is located on a part of the top surface of the data line and extends along the third direction; an isolation structure inside the semiconductor column; along the second direction, the thickness of the isolation structure in different regions in the third direction is different, and the isolation structure runs through the semiconductor columns, and two of the first, the second and the third directions intersect each other. This improves the sensitivity of the second transistor to the change in current in the first transistor while reducing the leakage current in the first transistor.

20 Claims, 27 Drawing Sheets

(51) Int. Cl.

| | |
|---|---|
| ***H10D 30/01*** | (2025.01) |
| ***H10D 30/40*** | (2025.01) |
| ***H10D 64/27*** | (2025.01) |

(58) Field of Classification Search

CPC ...... H10D 64/514; H10D 30/63; H10D 62/10; H10D 62/122; H10D 62/115; H10D 62/124; B82Y 10/00

See application file for complete search history.

SEMICONDUCTOR STRUCTURE, ITS READ/WRITE CONTROLLING AND METHOD OF MAKING THE SAME

CROSS REFERENCES TO RELATED APPLICATIONS

This application claims the benefit of priority of Chinese patent application with the application number 202211185511.6, entitled "SEMICONDUCTOR STRUCTURE, ITS READ/WRITE CONTROLLING AND METHOD OF MAKING THE SAME", filed on Sep. 27, 2022, the contents of which are incorporated herein by reference in its entirety.

TECHNICAL FIELD

The present disclosure relates to the field of semiconductor technology, in particular to a semiconductor structure and its read/write control method and manufacturing method.

BACKGROUND

During developing higher integration density of dynamic memory devices, at the time of researching on the transistor structures in the dynamic memory array and reducing the size of a single functional device structure in the dynamic memory array, it is also needed to improve the electrical performance of those small-size functional devices.

When applying a vertical GAA (Gate-All-Around) transistor structure as a dynamic memory selection transistor (access transistor), the occupied area can reach 4F2 (F: minimum pattern size available under given process conditions). Although in principle a higher density efficiency can be achieved, but it is not easy to manufacture the capacitance structures that work with the GAA transistor to complete the data storage and reading work, and it is not easy to form a capacitance structure with a large aspect ratio and a high dimensional accuracy, so it is difficult to further improve the electrical performance of the dynamic memory devices.

SUMMARY

Embodiments of the present disclosure provide a semiconductor structure and its reading and writing control method and manufacturing method, the technique reduces the leakage current in the first transistor and improves the sensitivity of the second transistor to the current change in the first transistor, so to enhance the electrical performance.

Some embodiments of the present disclosure provide a semiconductor structure which includes: a substrate and data line located on the substrate, the data lines extend along a first direction; a first transistor on the top of the data line and the second transistor on the side away from the data line of the first transistor; wherein, both the first transistor and the second transistor include: a semiconductor column, and the semiconductor column is located at part of the top surface of the data line extends along the third direction; the semiconductor column has an isolation structure inside, along the second direction, the thickness of the isolation structure in different regions is different in the third direction, and the isolation structure runs through the semiconductor column, and the first direction, the second direction and the third direction intersect each other.

In some embodiments, the semiconductor column has opposite first and second sides in the second direction, a direction along the first side pointing to the inside of the semiconductor column, and a direction along the second side points in a direction inside the semiconductor column, and the thickness of the isolation structure gradually decreases in the third direction.

In some embodiments, the semiconductor column on the side of the isolation structure close to the data line is a first semiconductor column, and the first transistor includes the first semiconductor column; the first transistor also includes: a gate structure located on a part of the sidewall extending along the second direction and surrounding the first semiconductor column.

In some embodiments, the semiconductor column located on the side of the isolation structure away from the data line is a second semiconductor column, and the second transistor includes the second semiconductor column; the second transistor, it also includes: a first conductive layer located on part of the sidewall of the second semiconductor column extending along the third direction; a second conductive layer located on the top surface of the second semiconductor column away from the data line; a dielectric layer between the first conductive layer and the second semiconductor column, and between the second conductive layer and the second semiconductor column.

In some embodiments, if the second transistor is in an on state, the second semiconductor column directly opposite to the first conductive layer and directly opposite to the second conductive layer constitutes the first For the channel region of the second transistor, the first conductive layer, the second conductive layer and the channel region constitute a transmission path for the conduction current of the second transistor.

In some embodiments, the second transistor comprises a single electron transistor.

In some embodiments, the dielectric layer includes a first dielectric layer and a second dielectric layer, the first dielectric layer is located between the first conductive layer and the second semiconductor column, and the first dielectric layer is located between the second conductive layer and the second semiconductor column; along the third direction, the average thickness of the isolation structure is the first thickness, and the thickness of the second dielectric layer is A second thickness, along the second direction, the thickness of the first dielectric layer is a third thickness, the first thickness is greater than the second thickness, and the first thickness is greater than the third thickness.

In some embodiments, the second thickness is equal to the third thickness.

In some embodiments, the dielectric layer surrounds the sidewall of the second semiconductor column extending along the third direction; the first conductive layer extends along the second direction, and the first conductive layer corresponds to the plurality of second semiconductor columns arranged at intervals along the second direction.

In some embodiments, the second conductive layer extends along the first direction, and the second conductive layer corresponds to the plurality of semiconductor columns arranged at intervals along the first direction.

In some embodiments, along the third direction, the first semiconductor column includes a first region, a second region and a third region arranged in sequence; wherein, the first region and the data line contact connection, the gate structure surrounds the sidewall extending along the third direction of the second region, and the third region is contact-connected to the isolation structure; the projection of the positive side of the third region on the substrate is a first orthographic projection, the orthographic projection of the second semiconductor column on the substrate is a second orthographic projection, and the second orthographic projection is located in the first orthographic projection.

In some embodiments, the gate structure includes: a gate dielectric layer extending along the second direction and surrounding a part of the sidewall of the first semiconductor column; a gate surrounding the gate dielectric layer away from One side of the second semiconductor column; along the second direction, the thickness of the gate dielectric layer is the fourth thickness, and the dielectric layer between the first conductive layer and the second semiconductor column, the thickness of the layer is a third thickness, the fourth thickness is greater than the third thickness.

According to some embodiments of the present disclosure, on the other hand, the embodiments of the present disclosure also provide a method for controlling reading and writing of a semiconductor structure, including: providing the semiconductor structure as described in any one of the above, where the isolation structure is located close to the semiconductor column on the side of the data line is a first semiconductor column, the semiconductor column on the side of the isolation structure away from the data line is a second semiconductor column, and the first semiconductor column is separated from the isolation structure. A part of the structural contact area is a storage node; the second transistor includes: a first conductive layer located on part of the sidewall of the second semiconductor column extending along the third direction; a second conductive layer located on the second semiconductor column is far away from the top surface of the data line; the first transistor is turned on to adjust the voltage at the storage node to realize the write operation to the storage node; the voltage at the storage node is determined by the conductivity of the second semiconductor column, applying a first voltage to one of the first conductive layer and the second conductive layer, detecting a second voltage at another of the first conductive layer and the second conductive layer which the first voltage is not applied to, and the conductivity of the second semiconductor column is determined by a difference between the second voltage and the first voltage, wherein the conductivity of the second semiconductor column determines the voltage at the storage node, so as to realize the read operation on the storage node.

In some embodiments, along the third direction, the first transistor includes a first region, a second region and a third region arranged in sequence, and surrounding the second region along the third direction A gate structure with extended sidewalls, the first region is contact-connected to the data line, the third region is contact-connected to the isolation structure, and the third region is the storage node; the write operation of the storage node includes: applying a third voltage to the data line, and applying a fourth voltage to the gate structure, so as to turn on the transmission path between the first region and the third region, causing the voltage at the third region to be affected by the voltage on the data line, so as to implement a write operation to the third region.

According to some embodiments of the present disclosure, another aspect of the present disclosure provides a method for manufacturing a semiconductor structure, including: providing an initial substrate; forming a data line and a first transistor in the initial substrate, the data A line extends along a first direction, one end of the first transistor is contacted and connected to the data line, and the initial substrate is left as a substrate; a second transistor is formed on a side of the first transistor away from the data line; wherein, the first transistor and the second transistor both include: a semiconductor column, the semiconductor column is located on a part of the top surface of the data line and extends along the third direction; the semiconductor column has an isolation structure inside, along the first In the two directions, the thickness of the isolation structure in different regions in the third direction is different, and the isolation structure penetrates the semiconductor column, and two of the first direction, the second direction and the third direction are intersecting.

In some embodiments, the forming the data line and the first transistor in the initial substrate includes: patterning the initial substrate to form the data lines which are arranged at intervals, and initial semiconductor columns are formed on a part of the top surface of the data lines, and the initial substrate is left as a substrate; a gate structure is formed, and the gate structure extends along the second direction And surrounding part of the sidewall of the initial semiconductor column, part of the initial semiconductor column and the gate structure constitute the first transistor.

In some embodiments, along the third direction, the initial semiconductor column includes a first region, a second region, a third region, a fourth region and a fifth region arranged in sequence, and the gate structure Surrounding the sidewall extending along the third direction in the second region; the step of forming the isolation structure includes: extending in the third direction in the first region, the third region and the fifth region forming a protective layer on the extended sidewalls, exposing only the sidewalls of the fourth region extending along the third direction; performing oxidation treatment on the exposed sidewalls of the fourth region to convert the fourth region For the isolation structure, the original semiconductor column remains as the semiconductor column; wherein, the semiconductor column located on the side of the isolation structure close to the data line is a first semiconductor column, and the semiconductor column located on the isolation structure away from the semiconductor column on one side of the data line is a second semiconductor column, the first region, the second region and the third region constitute the first semiconductor column, and the fifth region serves as the second semiconductor column.

In some embodiments, the oxidizing the exposed sidewall of the fourth region includes: performing an in-situ water vapor generation process on the exposed sidewall of the fourth region.

In some embodiments, after forming the isolation structure, the step of forming the second transistor includes: forming a first conductive layer, a dielectric layer and a second conductive layer, the first conductive layer is located on the part of the sidewall of the second semiconductor column extending along the third direction, the second conductive layer is located on the top surface of the second semiconductor column away from the data line, the dielectric layer is located on the first conductive layer between the second semiconductor column and between the second conductive layer and the second semiconductor column.

In some embodiments, the step of forming the dielectric layer includes: removing part of the protective layer of the sidewall of the second semiconductor column extending along the third direction, to expose the second semiconductor part of the sidewall of the pillar extending along the third direction, and exposing a side of the second semiconductor column away from the isolation structure; forming the dielectric layer on the exposed surface of the second semiconductor column.

In some embodiments, forming the dielectric layer on the exposed surface of the second semiconductor column includes: performing oxidation treatment on the exposed second semiconductor column, so that a dielectric layer is formed on the remaining surfaces of the second semiconductor column.

In some embodiments, other surfaces of the second semiconductor column are exposed except the side contacting with the isolation structure, and the protection layer is located on other surfaces of the second semiconductor column; after the second semiconductor column, before removing the protection layer, the method further includes: forming a first isolation layer extending along the second direction, the first isolation layer being located at phases arranged at intervals along the first direction. Adjacent to the second semiconductor columns.

In some embodiments, the dielectric layer includes a first dielectric layer and a second dielectric layer, the first dielectric layer is located between the first conductive layer and the second semiconductor column, and the second dielectric layers are located between the second conductive layer and the second semiconductor column; the steps of forming the first dielectric layer, the first conductive layer and the second dielectric layer include: An initial first dielectric layer is formed on the surface of the second semiconductor column, and the first isolation layer and the initial first dielectric layer enclose a first interval; an initial first conductive layer is formed in the first interval, and the initial first dielectric layer is formed in the first interval. A conductive layer fills the first gap and is located on the side of the initial first dielectric layer away from the second semiconductor column; etching back the initial first conductive layer, leaving the initial first conductive layer layer as the first conductive layer, and in the etch-back step, the initial first dielectric layer located on the top surface of the second semiconductor column away from the isolation structure is removed, and the initial first dielectric layer remains. The dielectric layer is used as the first dielectric layer, and part of the sidewall of the first dielectric layer extending along the third direction is exposed; a second isolation layer is formed, and the second isolation layer and the first conductive layer share filling the first gap; forming the second dielectric layer on the top surface of the second semiconductor column away from the first dielectric layer.

According to some embodiments of the present disclosure, another embodiment of the present disclosure further provides a transistor structure.

The technical scheme that the embodiment of the present disclosure provides has the following advantages:

The first transistor includes a part of the semiconductor column extending along the third direction, then the first transistor can be used as a GAA transistor, which is beneficial to reduce the leakage current in the first transistor. Moreover, the second transistor includes another part of semiconductor columns extending along the third direction. It can be understood that the semiconductor columns in the first transistor and the semiconductor columns in the second transistor can be integrally formed, and there is an isolation structure between the first transistor and the second transistor, so that it is beneficial to reduce the defect state density between the semiconductor column and the isolation structure in the first transistor, and reduce the defect state density between the semiconductor column and the isolation structure in the second transistor, thereby effectively it is beneficial to improve the electrical performance of the semiconductor structure as a whole. In addition, the first transistor can be used as a dynamic memory selection transistor, and the second transistor can be used as a structure for storing data, that is, as a capacitive structure. In this way, the storage or reading operation of data is realized through the first transistor and the second transistor.

BRIEF DESCRIPTION OF THE DRAWINGS

One or more embodiments are illustrated by the pictures in the accompanying drawings corresponding thereto, and these exemplary illustrations do not constitute a limitation to the embodiments, and the elements with the same reference numerals in the accompanying drawings are represented as similar Unless otherwise specified, the figures in the accompanying drawings do not constitute a scale limitation; in order to more clearly illustrate the technical solutions in the embodiments of the present disclosure or conventional technologies, the following will briefly describe the accompanying drawings that need to be used in the embodiments, it is obvious that the drawings in the following description are only used for some embodiments of the present disclosure, and those skilled in the art can also obtain other drawings according to these drawings without creative work.

DETAILED DESCRIPTION OF THE PREFERRED EMBODIMENTS

Figure 1:
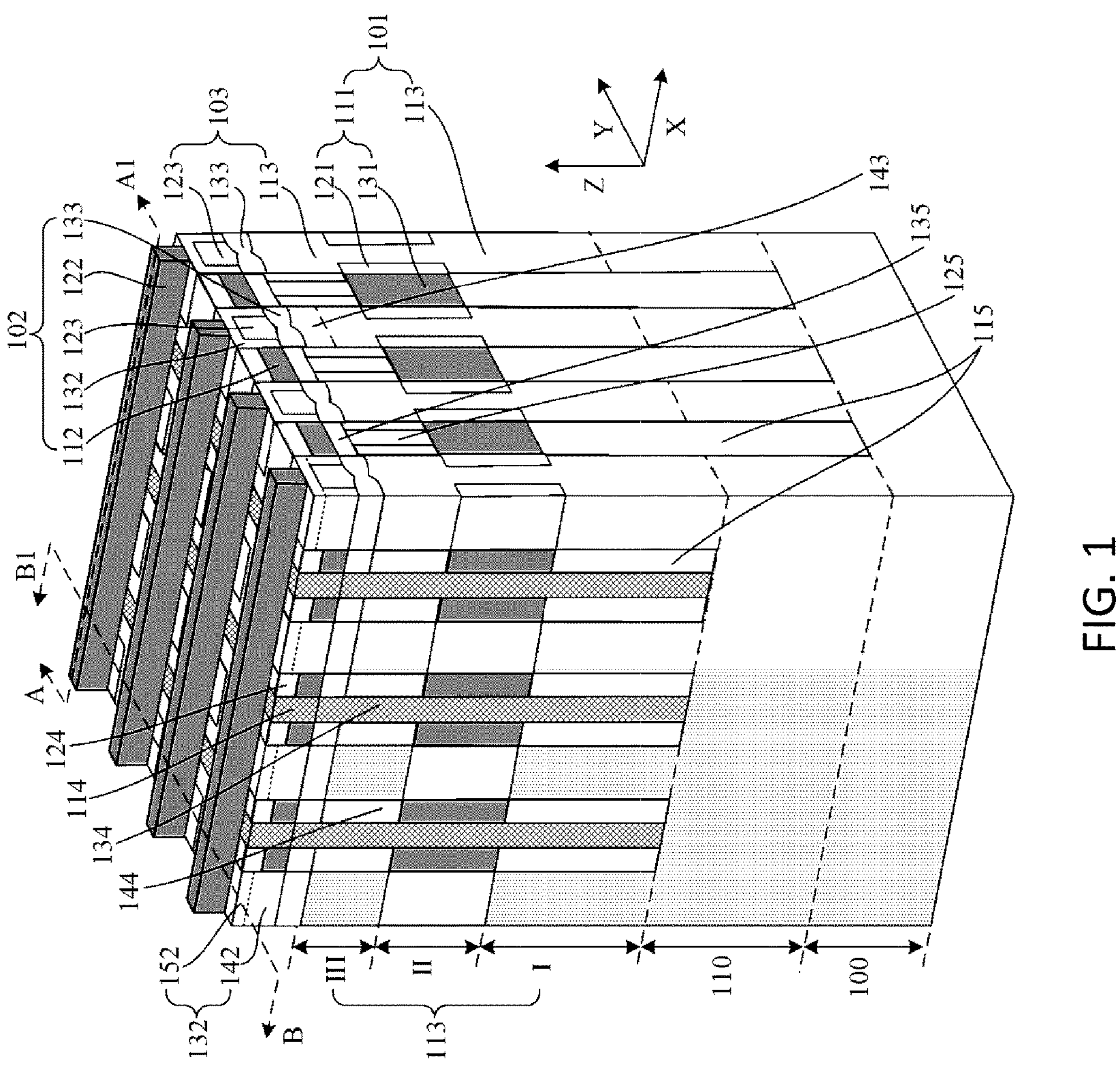
FIG. 1 is a schematic diagram of a three-dimensional semiconductor according to an embodiment of the present disclosure.

Embodiments of the present disclosure provide a semiconductor structure and its reading and writing control method and manufacturing method. In the semiconductor structure, the first transistor includes a part of the semiconductor column extending along the third direction, then the first transistor can be used as a GAA transistor, so it is beneficial to increase the integration density of the first transistor in the semiconductor structure and reduce the leakage current in the first transistor. Moreover, the second transistor includes another part of semiconductor columns extending along the third direction. It can be understood that the semiconductor columns in the first transistor and the semiconductor columns in the second transistor can be integrally formed, and there is an isolation structure between the first transistor and the second transistor, so that it is beneficial to reduce the defect state density between the semiconductor column and the isolation structure in the first transistor, and reduce the defect state density between the semiconductor column and the isolation structure in the second transistor, thereby effectively it is beneficial to improve the electrical performance of the semiconductor structure as a whole. In addition, the first transistor can be used as a dynamic memory selection transistor, and the second transistor can be used as a structure for storing data, that is, the role of a capacitor structure. In this way, the storage or reading operation of data is realized through the first transistor and the second transistor. Moreover, compared with the current capacitive structure, the second transistor has a smaller size and higher sensitivity to current changes in the first transistor.

Various embodiments of the present disclosure will be described in detail below in conjunction with the accompanying drawings. However, those of ordinary skill in the art can understand that, in each embodiment of the present disclosure, many technical details are provided for readers to better understand the embodiments of the present disclosure. However, even without these technical details and various changes and modifications based on the following embodiments, the technical solutions claimed in the embodiments of the present disclosure can be realized.

An embodiment of the present disclosure provides a semiconductor structure, and the semiconductor structure provided by an embodiment of the present disclosure will be described in detail below with reference to the accompanying drawings. 1 is a schematic diagram of a three-dimensional structure corresponding to a semiconductor structure provided by an embodiment of the present disclosure; FIG. 2 is a schematic cross-sectional view of the structure shown in FIG. 1 along the first cross-sectional direction AA1; FIG. 3 is a schematic cross-sectional view of the structure shown in FIG. 1 along the second cross-section A schematic cross-sectional view of direction BB1; FIG. 4 is a schematic top view of a gate structure and a first conductive layer in a semiconductor structure provided by an embodiment of the present disclosure.

It should be noted that, in order to facilitate the description and clearly illustrate the steps of the semiconductor structure manufacturing method, FIGS. 1 to 4 in this embodiment are partial structural schematic diagrams of the semiconductor structure.

FIGS. 1 to 4, the semiconductor structure includes: a substrate 100 and a data line 110 on the substrate 100, the data line 110 extends along a first direction X; a first transistor 101 on the data line 110 and a first transistor 101 and the second transistor 102 on the side of the first transistor 101 away from the data line 110; wherein, both the first transistor 101 and the second transistor 102 include: a semiconductor column 103, and the semiconductor column 103 is located on a part of the top surface of the data line 110 and along the third direction Z extends; there is an isolation structure 133 inside the semiconductor column 103, along the second direction Y, the thickness of the isolation structure 133 in different regions is different in the third direction Z, and the isolation structure 133 runs through the semiconductor column 103, and two of the first direction X, the second direction Y and the third direction Z intersect.

It can be understood that the first transistor 101 can be used as a dynamic memory selection transistor, and the second transistor 102 can be used as a structure for storing data, that is, the role of a capacitor structure, so that via the first transistor 101 and the second transistor 102 the storage or reading operation of data is realized, and the second transistor 102 has a smaller size than the current capacitor structure, which is conducive to further reducing the overall size of the semiconductor structure. Moreover, the second transistor 102 is smaller than the current capacitor structure. The capacitive structure has a higher sensitivity to the current change in the first transistor 101, which is conducive to realizing the storage or reading operation of data within a smaller current change range, thereby helping to reduce the power consumption of the semiconductor structure during operation.

The embodiments of the present disclosure will be described in more detail below in conjunction with the accompanying drawings.

In some embodiments, the material type of the substrate 100 may be an elemental semiconductor material or a crystalline inorganic compound semiconductor material. The elemental semiconductor material can be silicon or germanium; the crystalline inorganic compound semiconductor material can be silicon carbide, silicon germanium, gallium arsenide or gallium indium.

In some embodiments, the data line 110 can be a bit line, and the substrate 100, the bit line and the semiconductor column 103 have the same semiconductor element, and the substrate 100, the bit line and the semiconductor column 103 can use the same film layer structure Formed, the film layer structure is composed of semiconductor elements, so that the semiconductor column 103 and the bit line are integrated, thereby improving the interface state defects between the semiconductor column 103 and the bit line, so as to improve the performance of the semiconductor structure.

Wherein, the semiconductor element may include one of silicon, carbon, germanium, arsenic, gallium, and indium. In one example, both the bit line and the semiconductor column 103 include silicon.

In some embodiments, the material of the data line 110 may also include a metal-semiconductor compound, and the metal-semiconductor compound has a relatively small resistivity compared to an unmetallized semiconductor material. Therefore, as far as the semiconductor columns 103 are concerned, the resistivity of the data lines 110 is smaller, which is beneficial to reduce the resistance of the data lines 110 and the contact resistance between the data lines 110 and the semiconductor columns 103, further improving the electrical performance of the semiconductor structure. Taking silicon as the semiconductor element as an example, the metal-semiconductor compound may include one of cobalt silicide, nickel silicide, molybdenum silicide, titanium silicide, tungsten silicide, or tantalum silicide.

In some embodiments, a plurality of data lines 110 arranged at intervals may be formed on the substrate 100, and each data line 110 may be in contact with one semiconductor column 103. In FIGS. There are 4 data lines 110 spaced apart from each other, and each data line 110 is in contact with 4 semiconductor columns 103 as an example. In practical applications, the number of data lines 110 and the number of semiconductor columns 103 that contacts the data line 110 can be reasonably set according to actual electrical requirements.

In some embodiments, the third direction Z may be a direction in which the substrate 100 points to the data line 110.

In some embodiments, referring to FIG. 3, the semiconductor column 103 has opposite first sides a and second sides b in the second direction Y, a direction Y1 pointing to the inside of the semiconductor column 103 along the first side a, and Along the direction Y2 of the second side b pointing to the inside of the semiconductor column 103, the thickness of the isolation structure 133 in the third direction Z gradually decreases.

It can be understood that the isolation structure 133 may be formed by performing thermal oxidation treatment on part of the semiconductor column 103. During the thermal oxidation treatment, as time goes by, the less the area of the column 103 is converted into the isolation structure 133, the more the thickness of the isolation structure 133 gradually decreases in the third direction Z along the direction Y1 and the direction Y2.

In addition, the isolation structure 133 performs in-situ thermal oxidation treatment on a part of the semiconductor column 103, which is different from the top surface oxidation process and the oxidation deposition process. The in-situ oxidation treatment on the sidewall of the semiconductor column 103 is beneficial to form the isolation structure 133 penetrating the semiconductor column 103, and is beneficial to improve the density of the isolation structure 133. Moreover, along the direction Y1 and the direction Y2, the thickness of the isolation structure 133 in the third direction Z gradually decreases, which is beneficial to reduce the electron density. The probability of tunneling improves the device performance of semiconductor structures.

Figure 2:
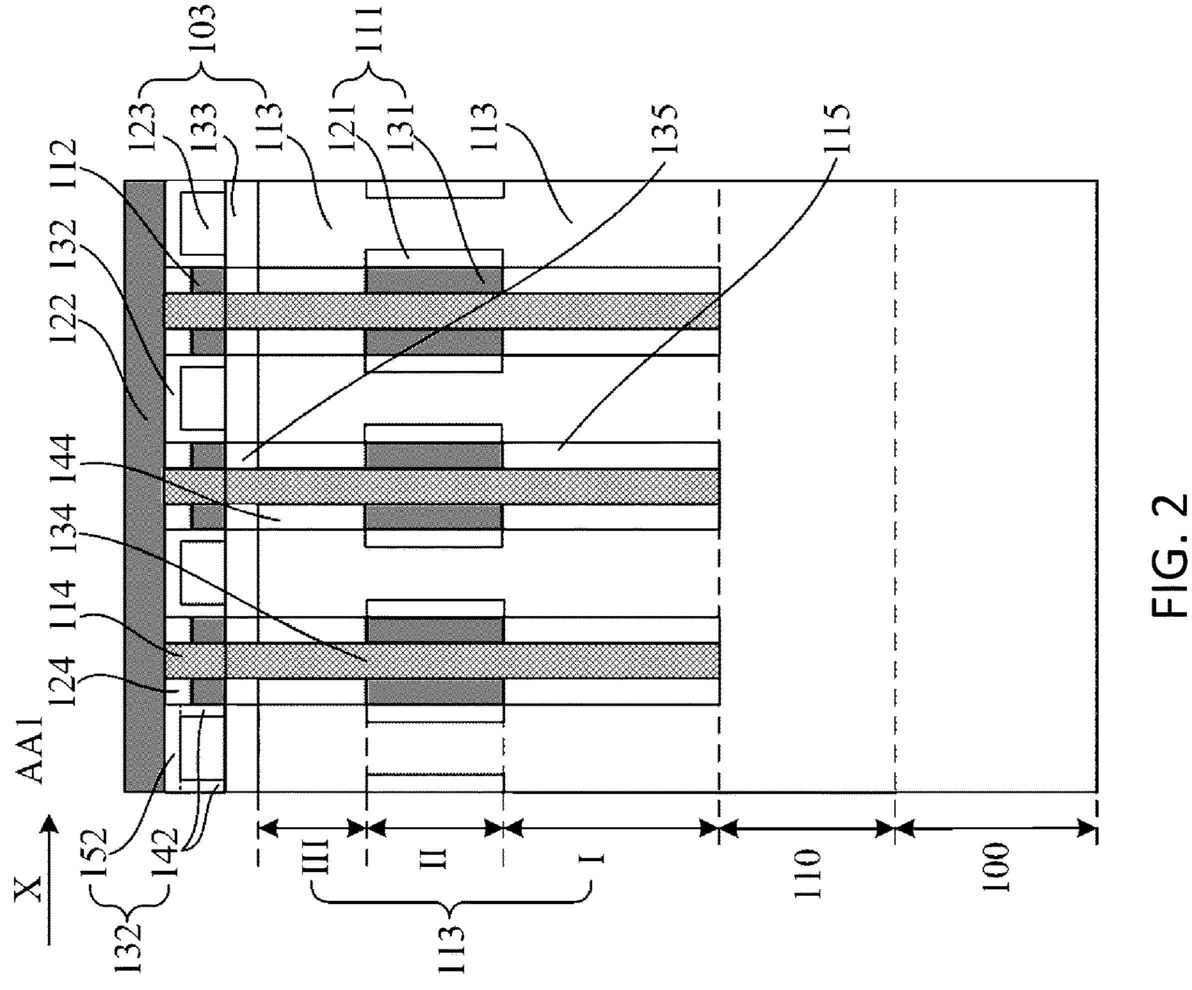
FIG. 2 is a schematic cross-sectional view of the structure shown in FIG. 1 along the first cross-sectional direction AA1.
Figure 3:
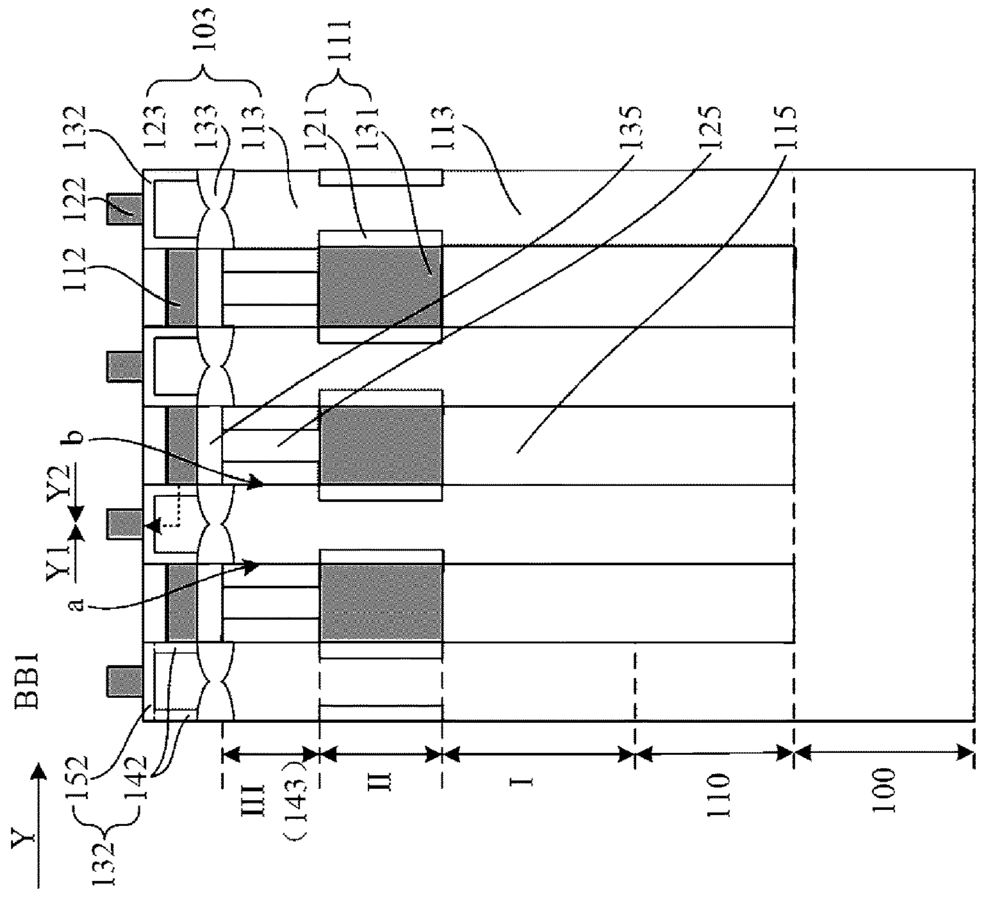
FIG. 3 is a schematic cross-sectional view of the structure shown in FIG. 1 along the second cross-sectional direction BB1.
Figure 4:
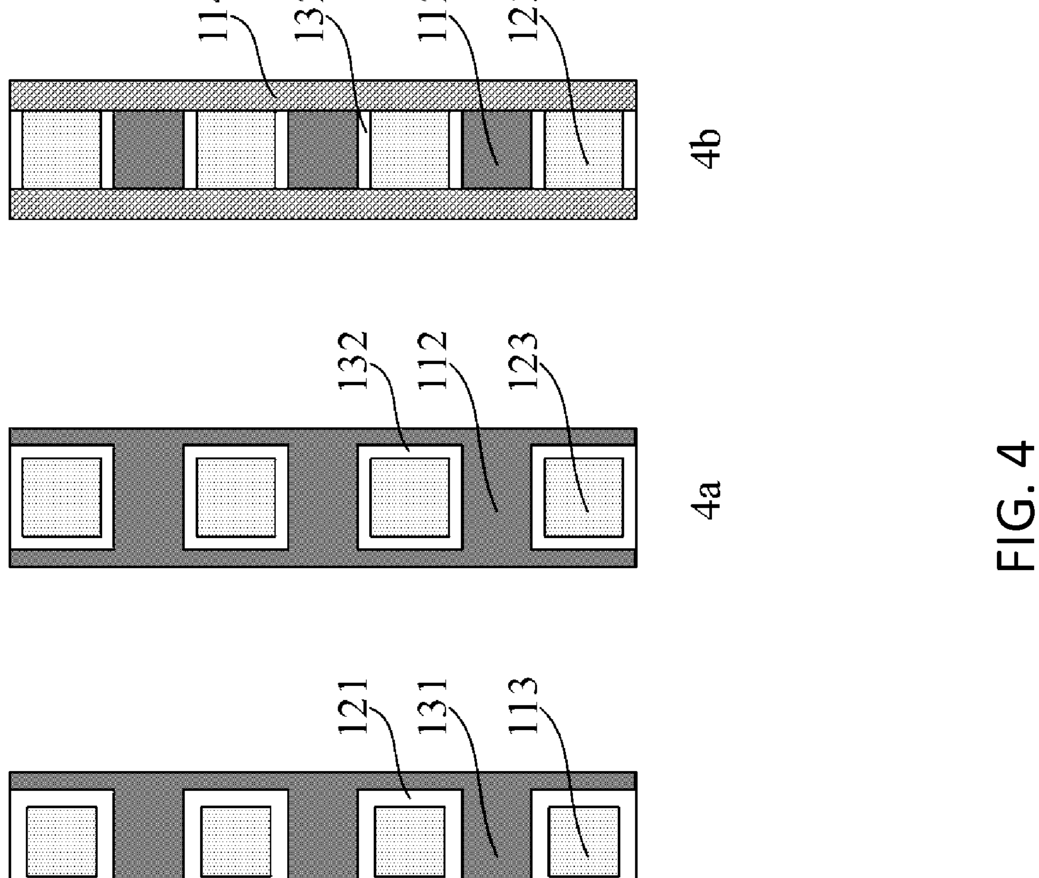
FIG. 4 is a schematic top view of a gate structure and a first conductive layer in a semiconductor structure according to an embodiment of the present disclosure.

In some embodiments, referring to FIG. 1 to FIG. 3, the semiconductor column 103 located on the side of the isolation structure 133 close to the data line 110 is the first semiconductor column 113, and the first transistor 101 includes the first semiconductor column 113; the first transistor 101 further includes: a gate structure 111 extending along the second direction Y and surrounding a part of the sidewall of the first semiconductor column 113, In some embodiments, referring to FIG. 1 to FIG. 4, the gate structure 111 includes: a gate dielectric layer 121, surrounding a part of the sidewall of the first semiconductor column 113 extending along the third direction Z; a gate 131, extending along the third direction Z; two directions Y extend and surround the gate dielectric layer 121 away from the sidewall of the first semiconductor column 113. It can be understood that the gate structure 111 corresponds to a plurality of first semiconductor columns 113 arranged at intervals along the second direction Y.

In some embodiments, referring to FIG. 1 to FIG. 4, the semiconductor column 103 located on the side of the isolation structure 133 away from the data line 110 is the second semiconductor column 123, and the second transistor 102 includes the second semiconductor column 123; the second transistor 102 further includes: a first conductive layer 112 located on part of the sidewall of the second semiconductor column 123 extending along the third direction Z; a second conductive layer 122 located on the top surface of the second semiconductor column 123 away from the data line 110; a dielectric A layer 132 is located between the first conductive layer 112 and the second semiconductor column 123, and between the second conductive layer 122 and the second semiconductor column 123.

The dielectric layer 132 and the first conductive layer 112 will be described in detail below through two specific embodiments.

In some embodiments, referring to 4*a* in FIG. 4, the dielectric layer 132 surrounds the sidewall of the second semiconductor column 123 extending along the third direction Z, and the first conductive layer 112 extends along the second direction Y and surrounds the dielectric layer. 132 is away from the sidewall of the second semiconductor column 123. It can be understood that the first conductive layer 112 extends along the second direction Y, and the first conductive layer 112 corresponds to a plurality of second semiconductor columns 123 arranged at intervals along the second direction Y. In this way, it is beneficial to simplify the preparation process of the first conductive layer 112, and to control the second semiconductor column 123 or detect the conductivity of the second semiconductor column 123 at different times through the same first conductive layer 112, In some other embodiments, referring to 4*b* in FIG. 4, the dielectric layer 132 is located only on the two opposite sidewalls of the second semiconductor column 123 along the second direction Y, and the first conductive layer 112 is located away from the dielectric layer 132. The two sidewalls of the second semiconductor column 123, so that one first conductive layer 112 corresponds to one second semiconductor column 123, and the two opposite sidewalls of the second semiconductor column 123 are connected to the first isolation layer along the first direction X. 114 for contact connection, and the first isolation layer 114 will be described in detail later. In addition, in practical applications, the dielectric layer 132 can surround the sidewalls of the second semiconductor column 123 extending along the third direction Z, and the first conductive layer 112 is only located on the two opposite sidewalls of the dielectric layer 132 along the second direction Y.

In some embodiments, the second conductive layer 122 extends along the first direction X, and the second conductive layer 122 corresponds to a plurality of semiconductor columns 103 arranged at intervals along the first direction X. In this way, it is beneficial to simplify the preparation process of the second conductive layer 122, and to control the second semiconductor column 123 or detect the conductivity of the second semiconductor column 123 at different times through the same second conductive layer 122.

In some embodiments, if the second transistor 102 is in an on state, the second semiconductor column 123 facing the first conductive layer 112 and facing the second conductive layer 122 constitutes the channel of the second transistor 102 region, the first conductive layer 112, the second conductive layer 122 and the channel region constitute the transmission path of the conduction current of the second transistor 102. It can be understood that since the first conductive layer 112 is located on the sidewall of the second semiconductor column 123 extending along the third direction Z, the second conductive layer 122 is located on the top surface of the second semiconductor column 123 away from the substrate 100, that is, the first conductive layer 112 and the second conductive layer 122 are not located in the same plane, so that the conduction current is not transmitted in a plane, but transmitted in a three-dimensional space.

In one example, referring to FIG. 3, the transmission path of conduction current enters the second semiconductor column 123 through the first conductive layer 112 through the dielectric layer 132, and turns in the second semiconductor column 123, and passes through the dielectric layer 132 into the second conductive layer 122. In this way, the entire second semiconductor column 123 can be used as a channel region when the second transistor 102 is in the on state.

In some embodiments, the first conductive layer 112 can be used as the source electrode of the second transistor 102, and the second conductive layer 122 can be used as the drain electrode of the second transistor 102. In some other embodiments, the first conductive layer 112 may also serve as the drain of the second transistor 102, and the second conductive layer 122 may also serve as the source of the second transistor 102, In some embodiments, the second transistor 102 includes a single electron transistor (SET, single electron transistor). Part of the first semiconductor column 113 in the first transistor 101 that is in contact with the isolation structure 133 is used as the gate of the second transistor 102. When the single-electron transistor works, only a small amount of electrons is needed, so that the gate of the second transistor 102 generates a small voltage. When the voltage changes, the single-electron transistor can sensitively and accurately sense the difference in the voltage at the gate of the second transistor 102, which is beneficial to improve the first transistor 102 to the part of the first transistor 101 that is in contact with the isolation structure 133. The sensing sensitivity of the current change in the semiconductor column 113 makes the second transistor 102 have extremely low power consumption and extremely high switching speed. Understandably, single-electron transistors have the advantages of small size, high speed, high sensitivity, and most importantly, low power consumption compared to conventional transistors.

In addition, the second transistor 102 has a smaller volume than the current capacitor structure, which is beneficial to further reduce the overall size of the semiconductor structure.

In some embodiments, referring to FIGS. 1 to 3, the dielectric layer 132 includes a first dielectric layer 142 and a second dielectric layer 152, and the first dielectric layer 142 is located between the first conductive layer 112 and the second semiconductor column 123. Between, the second dielectric layer 152 is located between the second conductive layer 122 and the second semiconductor column 123; along the third direction Z, the average value of the thickness of the isolation structure 133 is the first thickness, and the thickness of the second dielectric layer 152 is the second thickness along the second direction Y, the thickness of the first dielectric layer 142 is a third thickness, the first thickness is greater than the second thickness, and the first thickness is greater than the third thickness T3.

It should be noted that, in some embodiments, the first dielectric layer 142 and the second dielectric layer 152 can be integrally formed, that is, the first dielectric layer 142 and the second dielectric layer 152 are formed by the same preparation process, and the dielectric layer 132 is a whole. In FIGS. 1 to 3, the first dielectric layer 142 and the second dielectric layer 152 are taken as an example; in other embodiments, the first dielectric layer 142 and the second dielectric layer 152 can be It is a different film layer structure, that is, the dielectric layer 132 is a multilayer structure.

In some embodiments, the second thickness is equal to the third thickness. In one example, the first thickness may be 5 nm, and the second and third thicknesses may be about 1 nm.

In some embodiments, referring to FIG. 1 to FIG. 3, along the third direction Z, the first semiconductor column 113 includes a first region I, a second region II, and a third region III arranged in sequence; wherein, the first region I is in contact with the data line 110, the gate structure 111 surrounds the sidewall of the second region II extending along the third direction Z, and the third region III is in contact with the isolation structure 133; the projection the positive side of the third region III on the substrate 100 is a first orthographic projection, and the orthographic projection of the second semiconductor column 123 on the substrate 100 is a second orthographic projection, and the second orthographic projection is located in the first orthographic projection.

It can be understood that the second region II facing the gate structure 111 can be used as a channel region when the first transistor 101 is in an on state, and the gate structure 111 and the first semiconductor column 113 can form a GAA transistor, that is, the first transistor 101 may be a GAA transistor, and the data line 110 is located between the substrate 100 and the GAA transistor, so that a 3D stacked storage device can be formed, which is beneficial to increase the integration density of the semiconductor structure.

In some embodiments, the dielectric layer 132 may be obtained by performing thermal oxidation treatment on the surface of the second semiconductor column 123, that is, the part of the second semiconductor column 123 at the periphery of the second semiconductor column 123 is converted into a dielectric layer 132. In this way, the orthographic projection of the second semiconductor column 123 on the substrate 100, that is, the second orthographic projection is reduced, so that the second orthographic projection is located in the first orthographic projection.

In some embodiments, the orthographic projection of the second region II on the substrate 100 is smaller than the orthographic projection of the third region III on the substrate 100, and smaller than the orthographic projection of the first region I on the substrate 100, perpendicular to In the section in the third direction Z, it is beneficial to form the second region II with a smaller cross-sectional area, and it is beneficial to improve the control ability of the gate structure 111 surrounding the sidewall of the second region II on the second region II, so that it is easier to control GAA transistors turned on or off. In other embodiments, the orthographic projections of the first region, the second region, and the third region on the substrate can be equal; or, the orthographic projections of the second region and the third region on the substrate are smaller than the first region on the substrate. orthographic projection.

In some embodiments, the first semiconductor column 113 is doped with dopant ions, and the dopant ions doped in the first region I and the third region III are of the same type, and the dopant ions doped in the second region II, the type of doping ions is different from the type of doping ions doped in the first region I, so it is beneficial to improve the electrical performance of the first transistor 101, for example, improving the conductivity of the first region I and the third region III and improving the first region I The on/off ratio of zone II. Wherein, the dopant ions include N-type ions and P-type ions. Specifically, the N-type ions may include one of arsenic ions, phosphorus ions or antimony ions; the P-type ions may include one of boron ions, indium ions or gallium ions.

In some embodiments, the gate structure 111 includes: a gate dielectric layer 121 located on a part of the sidewall extending along the second direction Y and surrounding the first semiconductor column 113; a gate 131 surrounding the gate dielectric layer 121 away from the first One side of the second semiconductor column 123; along the second direction Y, the thickness of the gate dielectric layer 121 is the fourth thickness, and the thickness of the dielectric layer 132 between the first conductive layer 112 and the second semiconductor column 123 is the third thickness, the fourth thickness is greater than the third thickness.

It can be understood that the first transistor 101 can be a GAA transistor, the second transistor 102 can be a single-electron transistor, and a part of the third region III in the first transistor 101 that is in contact with the isolation structure 133 constitutes the second gate of transistor 102. In the single-electron transistor, the thickness of the dielectric layer 132 corresponding to the first conductive layer 112 and the second conductive layer is very thin, about 1 nm, to ensure the high performance of the single-electron transistor; the thickness of the gate dielectric layer 121 between the second region II is relatively large, about 5 nm-10 nm, so as to ensure the high performance of the GAA transistor. In this way, making the fourth thickness greater than the third thickness is beneficial to improve the overall electrical performance of the first transistor 101 and the second transistor 102, In addition, in the first transistor 101, the region in the gate structure 111 that is in contact with the channel region II can be formed by performing thermal oxidation treatment on the surface of the channel region II, that is, the area on the periphery of the channel region III Part of the channel region III is transformed into a part of the gate structure; in the second transistor 102, the dielectric layer 132 can be obtained by thermal oxidation treatment on the surface of the second semiconductor column 123, or can be formed on the surface of the second semiconductor column 123 obtained by the deposition process; and, the fourth thickness is greater than the third thickness. In this way, the orthographic projection of the second region II on the substrate 100 is located at the orthographic projection of the second semiconductor column 123 on the substrate 100.

In some embodiments, with reference to FIG. 1 to FIG. 3, semiconductor structure also comprises:

The first isolation layer 114 is located between the adjacent first conductive layers 112 along the first direction X, and the first isolation layer 114 is used to realize the adjacent first conductive layers 112 along the first direction X.

The second isolation layer 124 covers the side of the first conductive layer 112 away from the substrate 100, the second isolation layer 124 and the first conductive layer 112 jointly cover the side wall of the dielectric layer 132 extending along the third direction X, the second isolation layer 124 is used to protect the first conductive layer 112 and prevent other electrical structures in the semiconductor structure from causing electrical interference to the first conductive layer 112.

The third isolation layer 134 is located between the adjacent gate structures 111 along the first direction X, and is used to realize electrical isolation between the adjacent gate structures 111 along the first direction X.

The fourth isolation layer 144 surrounds the sidewalls extending in the third direction Z of the third region III, and is used to realize the electrical isolation between two adjacent third zones III either in the first direction X or in the second direction Y.

It should be noted that the first isolation layer 114, the second isolation layer 124, the third isolation layer 134 and the fourth isolation layer 144 can be a single-layer structure or a multi-layer structure, for clarity of illustration, FIGS. 1 to 3 only schematically show the outlines of the above four isolation layers. In addition, in practical applications, in order to realize the electrical isolation between various adjacent conductive structures in the semiconductor structure, the division and setting of the isolation layer can be determined according to the actual needs and the actual manufacturing process. FIGS. 1 to 3 are only the above-mentioned example of a total isolation layer consisting of four isolation layers.

In addition, for clarity of illustration, in FIGS. 1 to 3, the first isolation layer 114 and the third isolation layer 134 are illustrated in the same filling manner, and the second isolation layer 124 is illustrated in another filling manner. In practical applications, two of the first isolation layer 114, the second isolation layer 124, the third isolation layer 134 and the fourth isolation layer 144 may be made of the same material. In one example, the materials of the first isolation layer 114, the second isolation layer 124, the third isolation layer 134 and the fourth isolation layer 144 can be one of silicon nitride or silicon oxynitride.

In some embodiments, referring to FIGS. 1 to 3, when the fourth isolation layer 144 surrounds the sidewall of the third region III extending along the third direction Z, a fourth isolation layer 144 corresponds to a third region III, so that the adjacent fourth isolation layer 144 has a first gap in the first direction X, and has a second gap in the second direction Y, and the first gap and the second gap are connected; the third isolation layer 134 along the second direction Y extends and fills the first gap; the semiconductor structure further includes:

The first insulating layer 115 is located between adjacent data lines 110 along the second direction Y, and surrounds the sidewalls of the first region I extending along the third direction Z, so as to achieve Electrical isolation between adjacent data lines 110 in Y, and electrical isolation between adjacent first regions I in the first direction X or in the second direction Y.

The second insulating layer 125 fills the second gap, so as to improve the electrical insulation effect between adjacent third regions III along the second direction Y.

The third insulating layer 135 extends along the second direction Y and is located between adjacent isolation structures 133 along the second direction Y, and the third isolation layer is also located between adjacent isolation structures 133 along the first direction X. between the third insulating layer 135 to improve the stability of the semiconductor structure.

It should be noted that, in practical applications, at least two of the materials of the first insulating layer 115, the second insulating layer 125 and the third insulating layer 135 may be the same. In one example, the materials of the first insulating layer 115, the second insulating layer 125 and the third insulating layer 135 can all be silicon oxide. In addition, the first insulating layer 115, the second insulating layer 125, and the third insulating layer 135 can all be of a single-layer structure or a multi-layer structure with the outer contour of the insulating layer. In addition, in practical applications, in order to realize the electrical isolation between various adjacent conductive structures in the semiconductor structure and the overall stability of the semiconductor structure, the division and setting of the insulating layer can be determined according to the actual needs and the actual preparation process, as shown in FIG. 1 to FIG. 3 are only examples of the overall insulating layer composed of the above three insulating layers.

In addition, for clarity of illustration, in FIGS. 1 to 3, the gate 131, the first conductive layer 112 and the second conductive layer 122 are shown in the same filling manner. In practical applications, the materials of two of the first conductive layer 112 and the second conductive layer 122 in the gate 131 may be the same, or the first conductive layer 112 and the second conductive layer 122 have different conductive materials. In one example, the materials of the gate 131, the first conductive layer 112 and the second conductive layer 122 can all be titanium nitride.

In summary, the first transistor 101 can be used as a dynamic memory selection transistor, and the second transistor 102 can be used as a structure for storing data, that is, the role of a capacitor structure, so that the storage or read operation of data can be realized in the first transistor 101 and the second transistor 102 together, and the first transistor 101 can be a GAA transistor, which is beneficial to improve the integration density of the semiconductor structure. Compared with the current capacitor structure, the second transistor 102 has a smaller size, which is beneficial to overall size of the semiconductor structure is further reduced, and the second transistor 102 has a higher sensitivity to the current change in the first transistor 101 than the current capacitor structure, which is beneficial to realize data processing within a smaller current change range. storage or read operations, thereby helping to reduce power consumption when the semiconductor structure is working.

Figure 5:
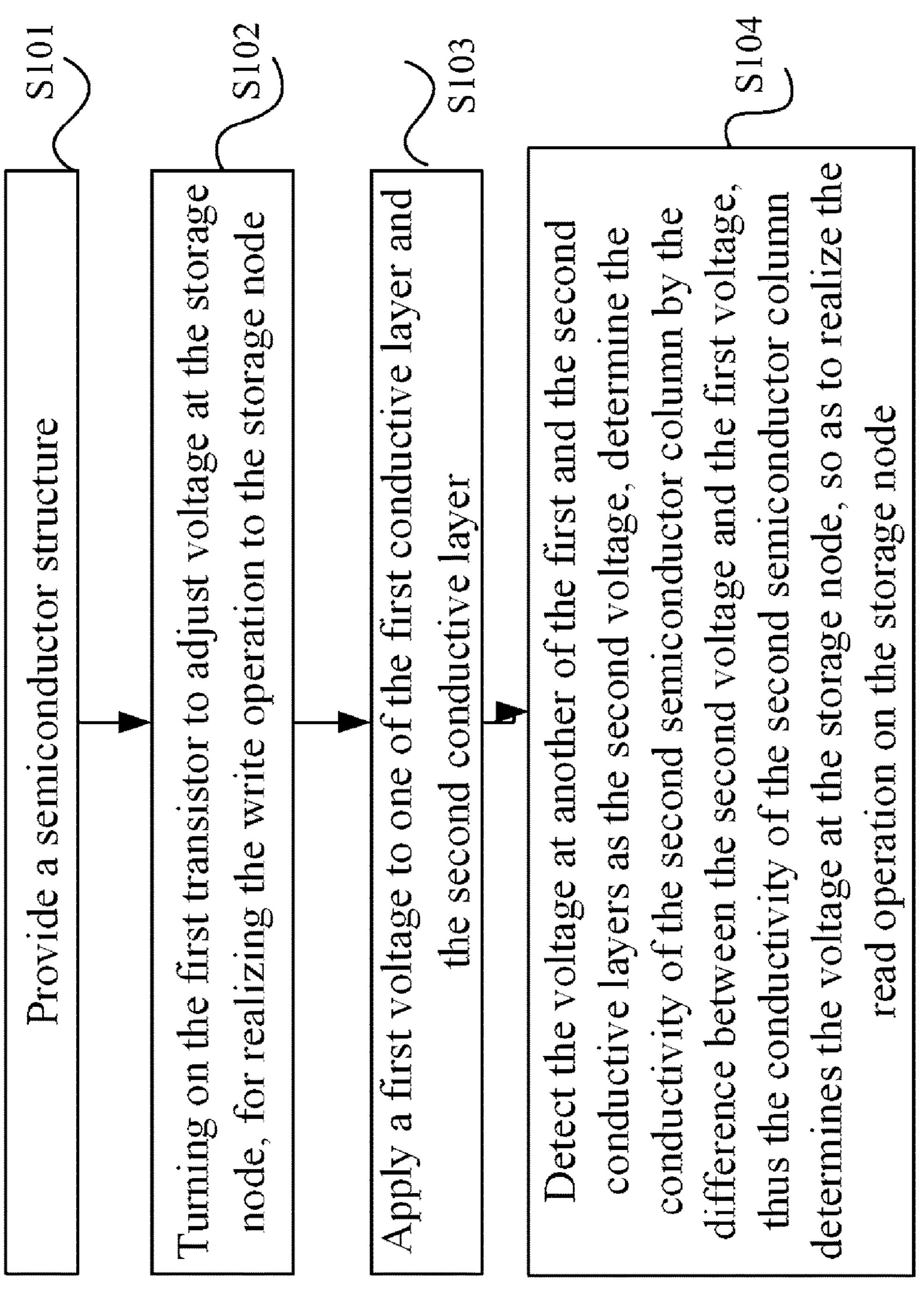
FIG. 5 is a flow chart of a method for controlling reading and writing of a semiconductor structure according to an embodiment of the present disclosure.

Another embodiment of the present disclosure further provides a method for controlling reading and writing of a semiconductor structure, which is used for controlling the semiconductor structure provided by an embodiment of the present disclosure. A method for controlling reading and writing of a semiconductor structure provided by another embodiment of the present disclosure will be described in detail below with reference to the accompanying drawings. FIG. 5 is a flow chart of a method for controlling reading and writing of a semiconductor structure provided by another embodiment of the present disclosure.

With reference to FIG. 1 to FIG. 5, the read-write control method of semiconductor structure comprises the steps:

S101: Provide a semiconductor structure according to an embodiment of the present disclosure.

Wherein, the semiconductor column 103 on the side of the isolation structure 133 close to the data line 110 is the first semiconductor column 113, the semiconductor column 103 on the side of the isolation structure 133 away from the data line 110 is the second semiconductor column 123, the first semiconductor column 123 Part of the area of the column 113 that is in contact with the isolation structure 133 is the storage node 143, In some embodiments, the storage node 143 may be a part of the third region III.

The second transistor 102 includes: a first conductive layer 112 located part of the sidewall of the second semiconductor column 123 extending along the third direction Z; a second conductive layer 122 located at the side of the second semiconductor column 123 away from the data line 110 top surface. In some embodiments, the first conductive layer 112 may be the source of the second transistor 102, and the second conductive layer 122 may be the drain of the second transistor 102, S102: Turning on the first transistor 101 to adjust the voltage at the storage node 143, so as to realize the write operation to the storage node 143.

It can be understood that the voltage at the first region I is affected by the data line 110, and when the first transistor 101 is turned on, the first region I and the third region III are turned on, so that the voltage at the third region III of the voltage at the storage node 143 is changed under the influence of the first region I, so as to adjust the voltage at the storage node 143 to realize the write operation to the storage node 143, In one example, the data line 110 transmits a high level to the first region I, and when the first transistor 101 is turned on, the voltage at the third region III also becomes a high level, so that the voltage at the storage node 143 also becomes is at a high level, at this time, the storage node 143 is equivalent to storing data "1".

S103: Apply a first voltage to one of the first conductive layer 112 and the second conductive layer 122.

S104: Detect the voltage at another of the first conductive layer 112 and the second conductive layer 122 which the first voltage is not applied to as the second voltage, determined the conductivity of the second semiconductor column 123 by the difference between the second voltage and the first voltage, wherein the conductivity of the second semiconductor column determines the voltage at the storage node 143, so as to realize the read operation on the storage node 143.

In some embodiments, the first voltage is applied to the first conductive layer 112, and the voltage at the second conductive layer 122 is detected as the second voltage. It can be understood that the voltage at the storage node 143 determines the conductivity of the second semiconductor column 123, the greater the voltage at the storage node 143, the greater the conductivity of the second semiconductor column 123 will be. Based on the difference in the conductivity of the second semiconductor column 123, under the premise that the value of the first voltage remains unchanged, the value of the detected second voltage is different. The higher the conductivity of the second semiconductor column 123 is, the higher the second voltage will be, and the value of will be closer to the value of the first voltage. Therefore, the conductivity of the second semiconductor column 123 can be determined based on the difference between the second voltage and the first voltage, the smaller the difference between the second voltage and the first voltage, the greater the conductivity of the second semiconductor column 123 is; and the voltage at the storage node 143 is larger.

In one example, if the voltage at the storage node 143 is at a high level, the conductivity of the second semiconductor column 123 is high, and the value of the detected second voltage is close to the value of the first voltage, that is, if the difference of the second voltage from the first voltage is small, it is determined that the data read at this time is "1", so as to realize the read operation on the storage node 143.

In some embodiments, along the third direction Z, the first transistor 101 includes sequentially arranged first region I, second region II and third region III, and surrounds the second region II along the third direction Z. The extended sidewall gate structure 111, the first region I is in contact with the data line 110, the third region III is in contact with the isolation structure 133, and the third region III is the storage node 143; the write operation to the storage node 143 is realized. Including: applying a third voltage to the data line 110, applying a fourth voltage to the gate structure 111, so as to conduct the transmission path between the first region I and the third region III, so that the voltage at the third region III is influenced by the voltage on the data line 110, thus to realize the write operation to the third region III.

It can be understood that the third voltage applied to the data line 110 is the voltage to be stored at the storage node 143, and the fourth voltage applied to the gate structure 111 is to make the first transistor 101 turn on state voltage.

In some embodiments, the first transistor 101 can be a GAA transistor, then the fourth voltage with a smaller value can be used to make the first transistor 101 in a conduction state, and the second transistor 102 can be a single-electron transistor, then the stored voltage at the node 143 has a small change, there will be a difference between the second voltage and the first voltage. Therefore, using the first transistor 101 and the second transistor 102 to realize the write operation and read operation of data is beneficial to reduce power consumption when the semiconductor structure is in operation.

To sum up, using the semiconductor structure provided by an embodiment of the present disclosure to realize the write operation and read operation of data is beneficial to realize the storage or read operation of data within a smaller range of voltage variation, thereby it is beneficial to reduce the power consumption when the semiconductor structure is working.

Another embodiment of the present disclosure further provides a method for manufacturing a semiconductor structure, which is used to prepare the semiconductor structure provided in an embodiment of the present disclosure. A method for manufacturing a semiconductor structure provided by another embodiment of the present disclosure will be described in detail below with reference to FIGS. 1 to 27.

Corresponding to each step of the manufacturing method are structural schematic diagrams of the semiconductor structure disclosed in FIGS. 6 to 27. It should be noted that the parts that are the same as or corresponding to the foregoing embodiments will not be repeated here. In addition, in order to facilitate the description and clearly illustrate the steps of the semiconductor structure manufacturing method, FIGS. 6 to 27 are partial structural schematic diagrams of the semiconductor structure.

Figure 7:
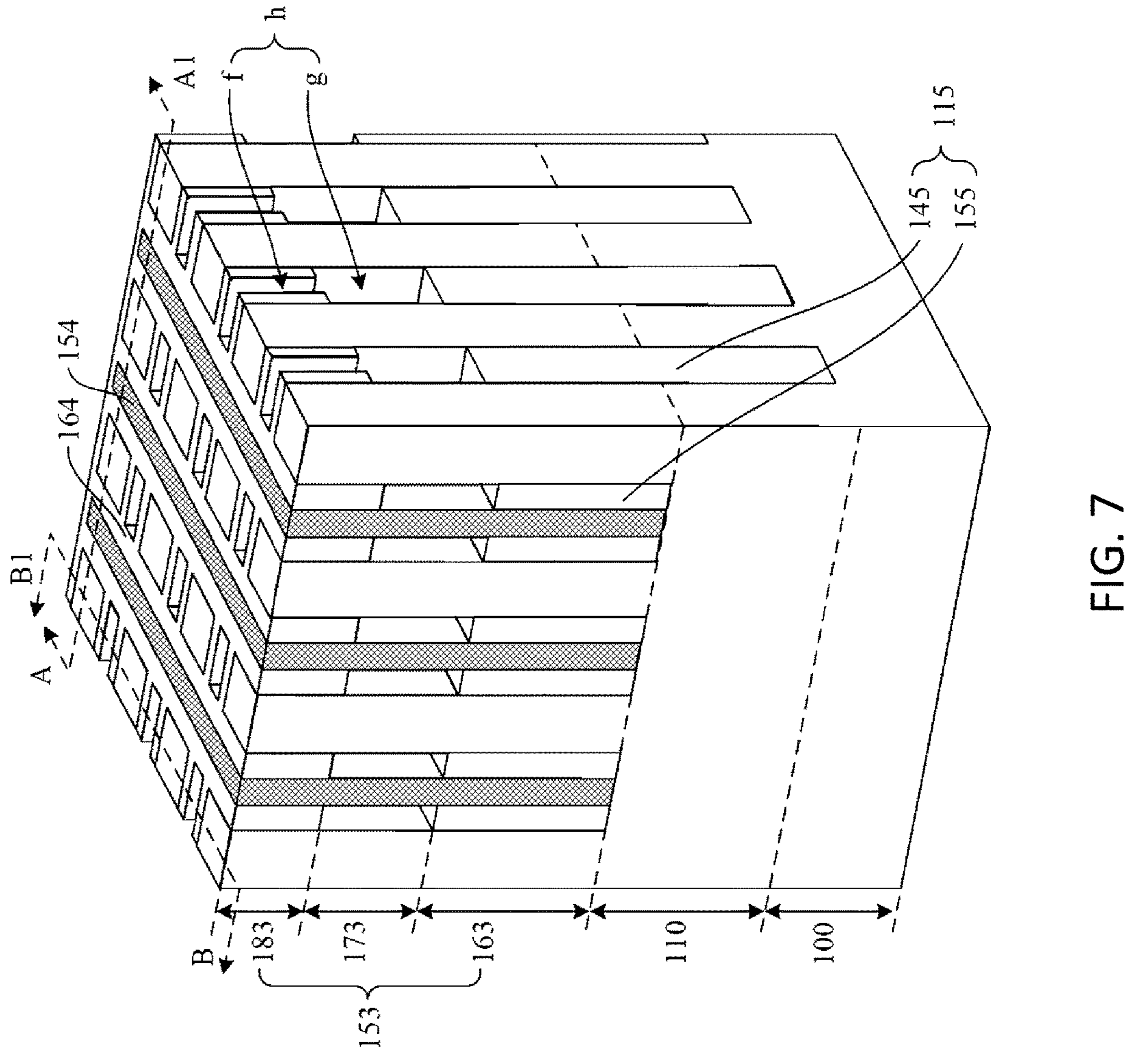
Figure 8:
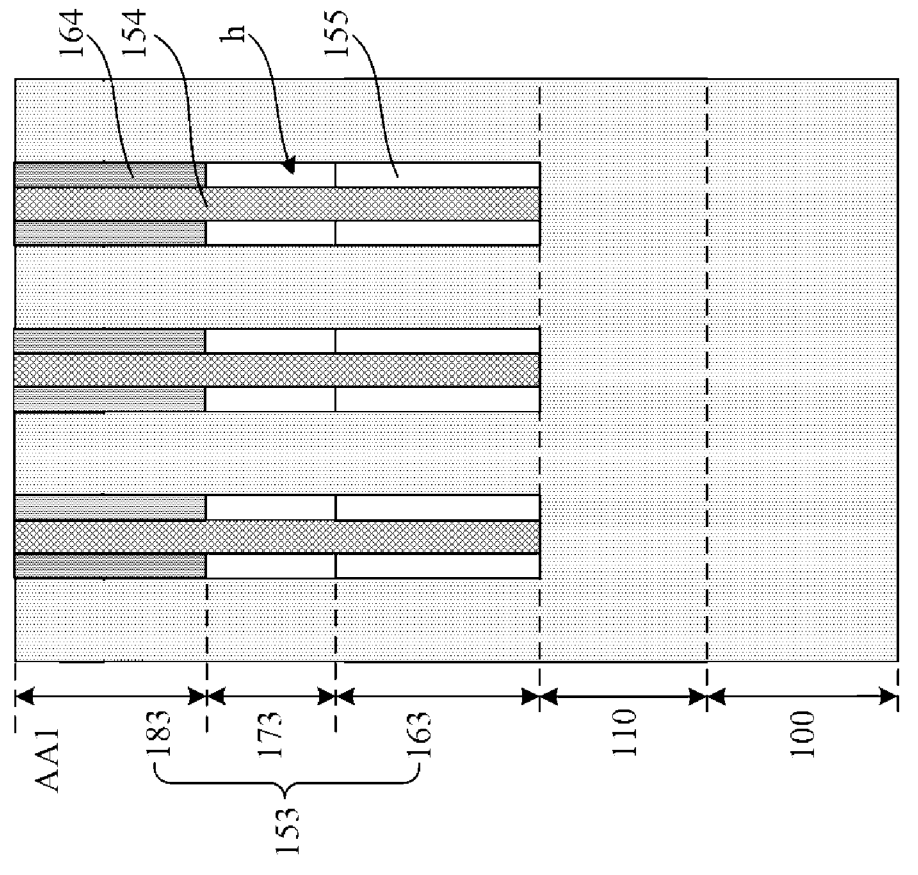
Figure 9:
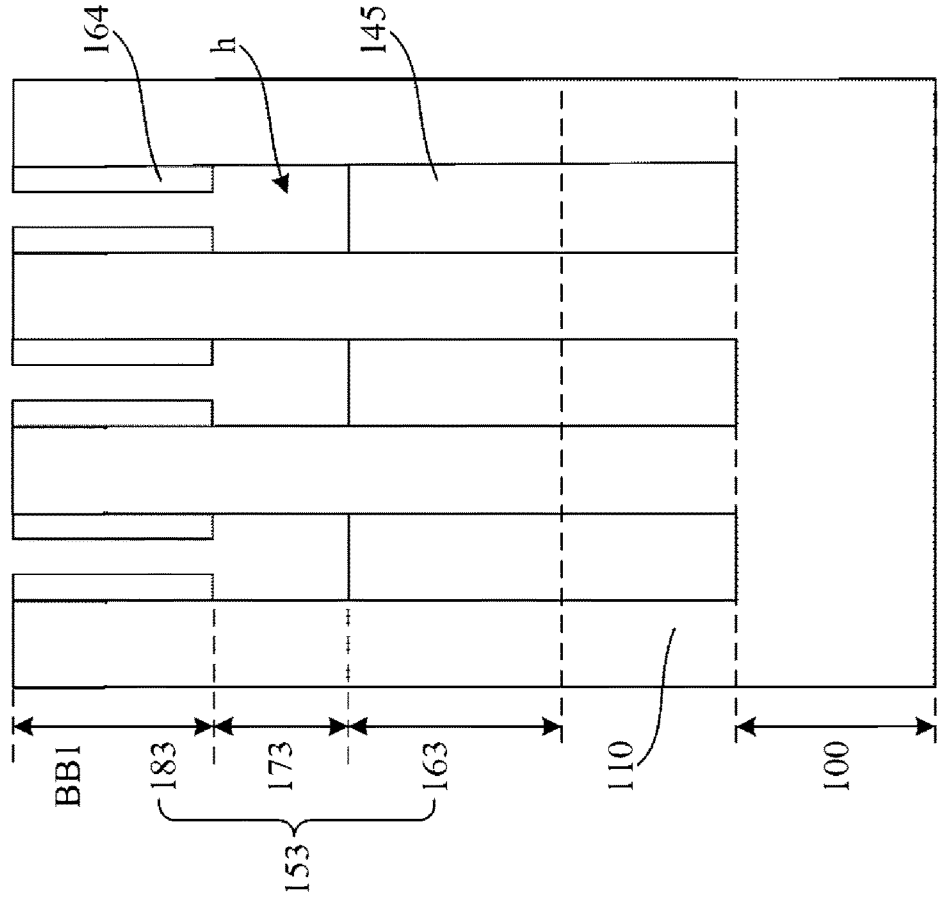

Wherein, FIG. 8 is a schematic cross-sectional view of the structure shown in FIG. 7 along the first cross-sectional direction AA1, and FIG. 9 is a schematic cross-sectional view of the structure shown in FIG. 7 along the second cross-sectional direction BB1. It should be noted that one or both of the schematic cross-sectional view along the first cross-sectional direction AA1 and the schematic cross-sectional view along the second cross-sectional direction BB1 will be provided later according to the needs of the expression. When only one drawing is referred to, the drawing is along a schematic cross-sectional view of the first cross-sectional direction AA1; when referring to two drawings at the same time, the drawings are first a schematic cross-sectional view along the first cross-sectional direction AA1, and second is a schematic cross-sectional view along the second cross-sectional direction BB1.

Referring to FIG. 1 to FIG. 27, the manufacturing method of semiconductor structure comprises the steps:

An initial substrate is provided, and the material type of the initial substrate may be an elemental semiconductor material or a crystalline inorganic compound semiconductor material. The elemental semiconductor material can be silicon or germanium; the crystalline inorganic compound semiconductor material can be silicon carbide, silicon germanium, gallium arsenide or gallium indium.

With reference to FIGS. 6 to 11, a data line 110 and a first transistor 101 are formed in the initial substrate, the data line 110 extends along the first direction X, one end of the first transistor 101 is connected to the data line 110, and the remaining initial substrate as the substrate 100.

Figure 6:
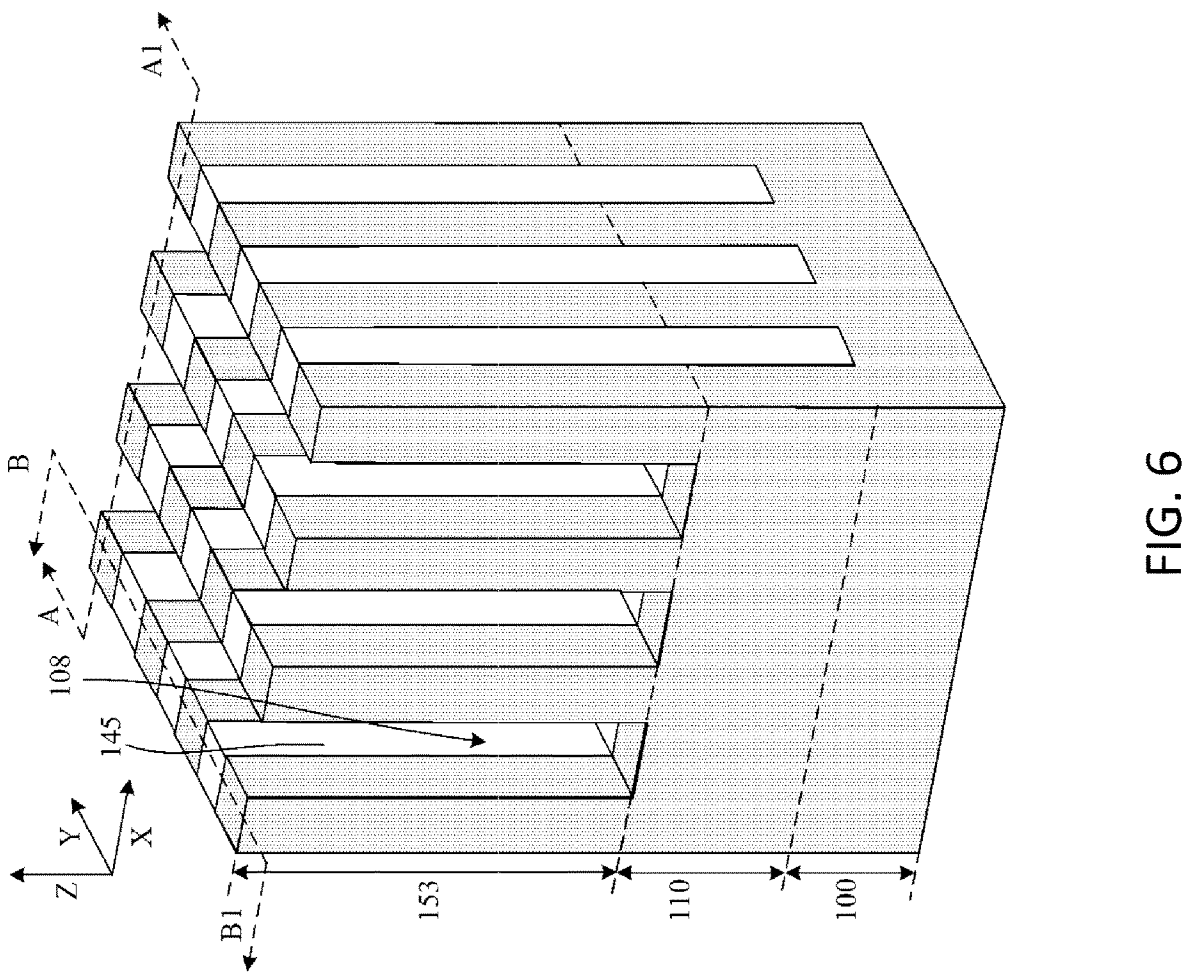
FIGS. 6 to 27 are structural schematic diagrams at each step of the manufacturing method of the semiconductor structure according to an embodiment of the present disclosure.

In some embodiments, forming the data line 110 and the first transistor 101 in the initial substrate may include the following steps:

Referring to FIG. 6, the initial substrate is patterned to form data lines 110 extending along the first direction X and arranged at intervals along the second direction Y, and to form initial semiconductor columns 153 located on part of the top surface of the data lines 110; the original substrate remained as the substrate 100.

In some embodiments, the process of patterning the initial substrate to form the data lines 110 and the initial semiconductor columns 153 may be divided into etching the initial substrate twice. In the first etching, the initial substrate is etched using a first mask layer having a plurality of first openings that are mutually separated and extend along the first direction X, and the length of the first openings is the same as that of the subsequently formed data lines. The length is the same, so as to form a plurality of first grooves extending along the first direction X; form an initial fourth insulating layer that fills the first grooves; the second mask layer of the second opening extending in the direction Y etches the initial substrate and the initial fourth insulating layer, and the length of the second opening is consistent with the length of the subsequently formed gate structure, so as to form a plurality of gate structures along the second direction. The Y-extending second trench 108 leaves the original fourth insulating layer as the fourth insulating layer 145.

In some embodiments, referring to FIG. 7 to FIG. 9, along the third direction Z, the initial semiconductor column 153 includes an initial first region 163, an initial second region 173 and an initial third region 183 arranged in sequence; Before forming the gate structure 111, the manufacturing method further includes the following steps:

Forming an initial fifth insulating layer, the initial fifth insulating layer is located on the sidewall of the second trench 108 extending along the third direction Z, and the initial fifth insulating layer located on the sidewall of the second trench 108 has the third trench; referring to FIG. 7, an initial third isolation layer 154 filling the third trench is formed; the initial fifth insulating layer and the fourth insulating layer 145 that are in contact with the initial third region 183 are removed to expose the initial third region along all sidewalls extending in the third direction Z; an initial fourth isolation layer 164 covering all sidewalls extending in the third direction Z of the initial third region is formed, and the initial fourth isolation layer 164 extends along the second direction A through hole f is formed between adjacent initial third regions 183 on Y, and the through hole f exposes part of the top surface of the fourth insulating layer 145.

Wherein, continuing to refer to FIG. 7 to FIG. 9, the initial third isolation layer 154 and the initial fourth isolation layer 164 together form a supporting framework, and the initial fifth insulating layer and the initial fifth insulating layer shown in FIG. 6 are etched with the supporting framework as a mask. The remaining initial fifth insulating layer is used as the fifth insulating layer 155. Referring to FIG. 7, between the initial first regions 163 adjacent in the direction Y, the fifth insulating layer 155 extends along the second direction Y, and is located between the initial first regions 163 adjacent in the first direction X. Wherein, the fourth insulating layer 145 and the fifth insulating layer 155 in FIG. 7 jointly constitute the first insulating layer 115, and the initial first region 163 subsequently serves as the first region of the first semiconductor column.

In addition, the supporting frame is in contact with the initial third region 183, and part of the supporting frame is embedded in the first insulating layer 115. In the step of etching the initial fifth insulating layer and the fourth insulating layer 145, on the one hand, the supporting frame plays a role of supporting and fixing the initial semiconductor column 153, when the etching process produces a pressing force on the initial semiconductor column 153, it is beneficial to prevent the initial semiconductor column 153 from being tilted or shifted due to extrusion, so as to improve the stability of the semiconductor structure; three zone 183 damage. After forming the first insulating layer 115, a third gap g is formed between the initial second region 173 and the initial third isolation layer 154, the through hole f and the third gap g together form a cave structure h, and the initial second region 173 is subsequently formed as the second region of the first semiconductor column.

Figure 10:
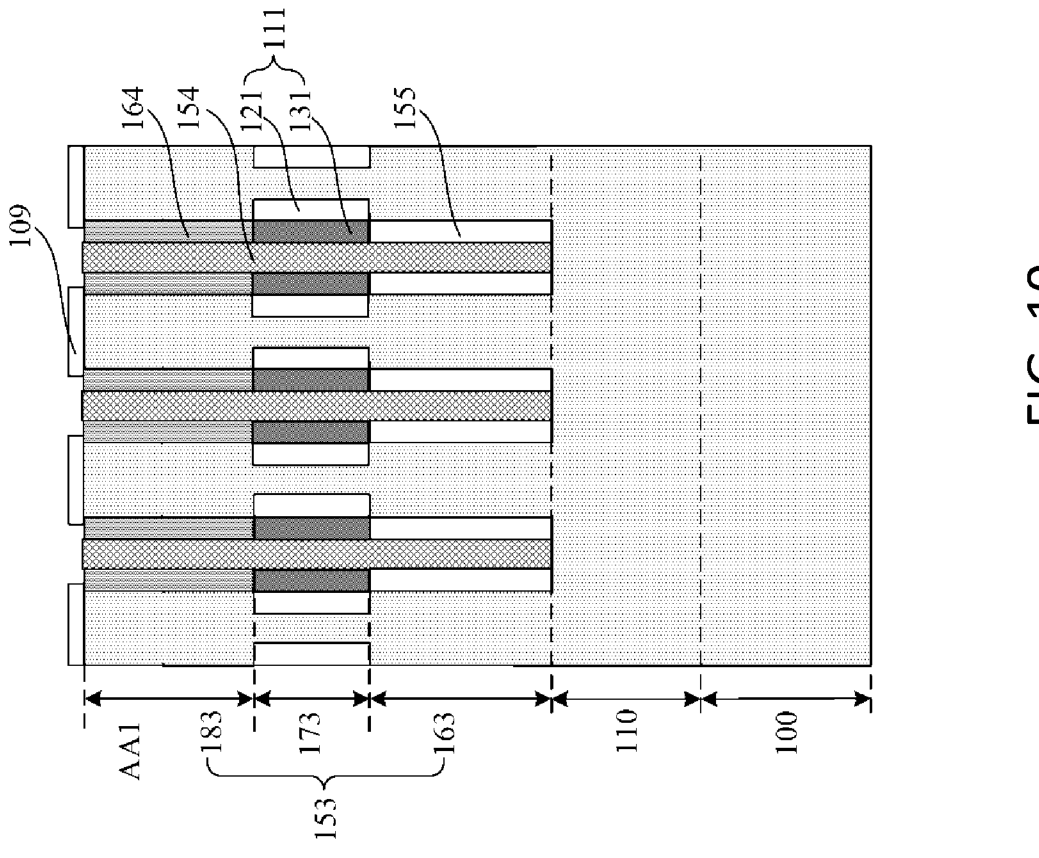
Figure 11:
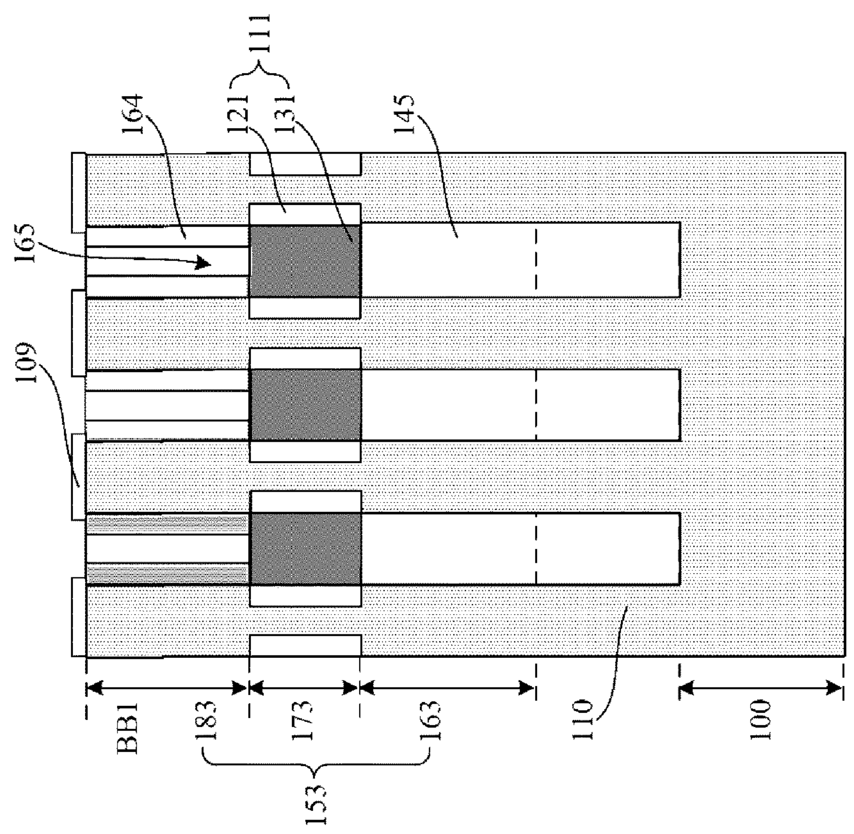

Referring to FIG. 10 and FIG. 11, a gate structure 111 is formed, the gate structure 111 extends along the second direction Y and surrounds part of the sidewall of the initial semiconductor column 153, and part of the initial semiconductor column 153 and the gate structure 111 constitute the first transistor 101.

In some embodiments, the step of forming the gate structure 111 includes: forming a first sacrificial layer 109 on the top surface of the initial third region 183 away from the substrate 100; the exposed sidewall of the third gap g, that is, the sidewall of the initial second region 173 extending along the third direction Z, is thermally oxidized to form the gate dielectric layer 121, and the gap between the gate dielectric layer 121 and the initial third isolation layer 154 is a fourth gap extending along the second direction Y; a gate 131 filling the fourth gap is formed, and the gate dielectric layer 121 and the gate 131 together constitute the gate structure 111.

Continuing to refer to FIG. 11, an initial second insulating layer 165 filling the through hole f is formed, the initial second insulating layer 165 is the basis for subsequent formation of the second insulating layer, and the first sacrificial layer 109 is removed.

It should be noted that the above-mentioned embodiment is only an example of forming the first transistor 101, and the manufacturing method provided by another embodiment of the present disclosure does not limit the forming method of the first transistor 101, for example, the gate dielectric layer can also be formed by a deposition process.

With reference to FIGS. 12 to 27, a second transistor 102 is formed on the side of the first transistor 101 away from the data line 110; wherein, the first transistor 101 and the second transistor 102 include: a semiconductor column 103, a semiconductor column 103 Located on part of the top surface of the data line 110 and extending along the third direction Z; the semiconductor column 103 has an isolation structure 133 inside, along the second direction Y, the thickness of the isolation structure 133 in different regions is different in the third direction Z, and the isolation structure 133 runs through the semiconductor column 103, and two of the first direction X, the second direction Y and the third direction Z intersect.

The formation of the isolation structure 133 and the second transistor 102 will be described in detail below.

In some embodiments, along the third direction Z, the initial semiconductor column 153 includes a first region I, a second region II, a third region III, a fourth region IV and a fifth region V arranged in sequence, and the gate pole structure 111 surrounds the sidewall extending along the third direction Z of the second region II. It can be understood that, with reference to FIG. 11 and FIG. 12, the first zone I is the initial first zone 163, the second zone II is the initial second zone 173, the third zone III, the fourth zone IV and the fifth zone V collectively constitute an initial third region 183, Referring to FIG. 12 to FIG. 18, the step of forming the isolation structure 133 includes: forming a protective layer 106 on the sidewalls of the first region I, the third region III and the fifth region V extending along the third direction Z, exposing only the side walls of the fourth region IV extend along the third direction Z.

Figure 12:
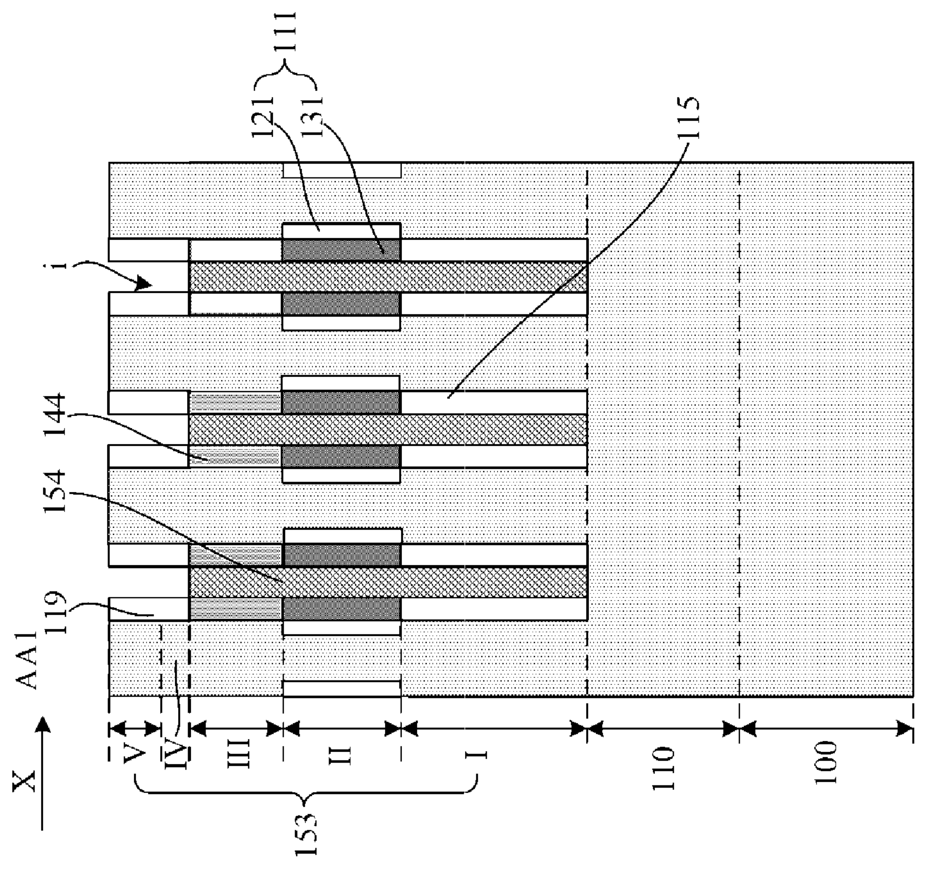
Figure 13:
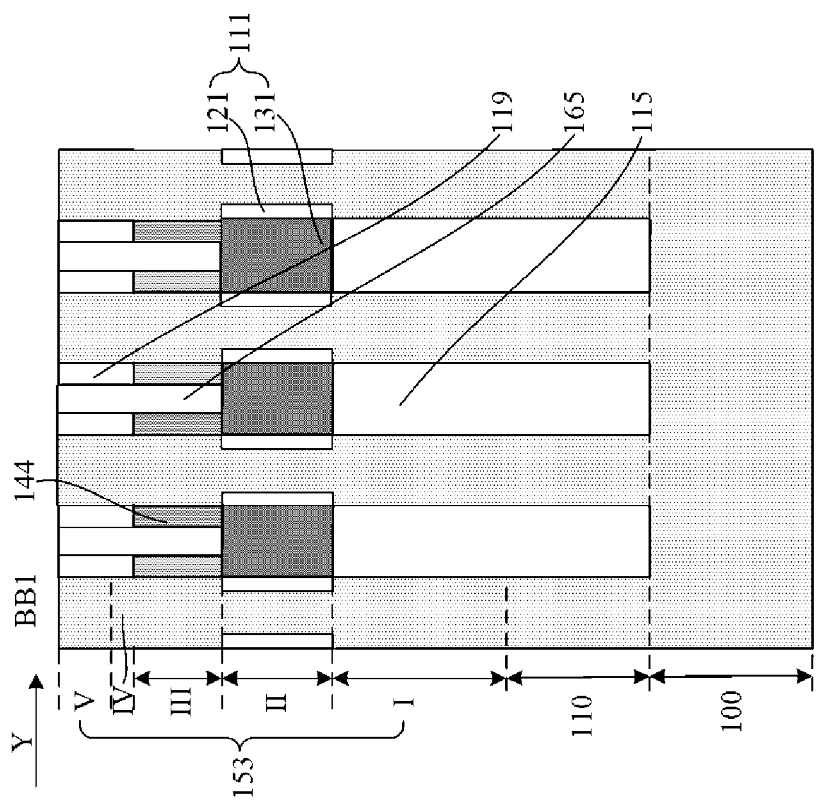

In some embodiments, forming protective layer 106 comprises the following steps:

Referring to FIGS. 10 to 13, the initial third isolation layer 154 and the initial fourth isolation layer 164 are etched to expose the side walls of the fourth region IV and the fifth region V extending along the third direction Z; the initial third isolation layer 154 remains as part of the third isolation layer 134 and the initial fourth isolation layer 164 remains as the fourth isolation layer 144, Referring to FIG. 12 and FIG. 13, a second sacrificial layer 119 is formed, the second sacrificial layer 119 is located on the sidewalls of the fourth region IV and the fifth region V extending along the third direction Z, and the initial second insulating layer 165 is in contact with the second sacrificial layer 119, and has a fifth gap i, the fifth gap i extends along the second direction Y.

Figure 14:
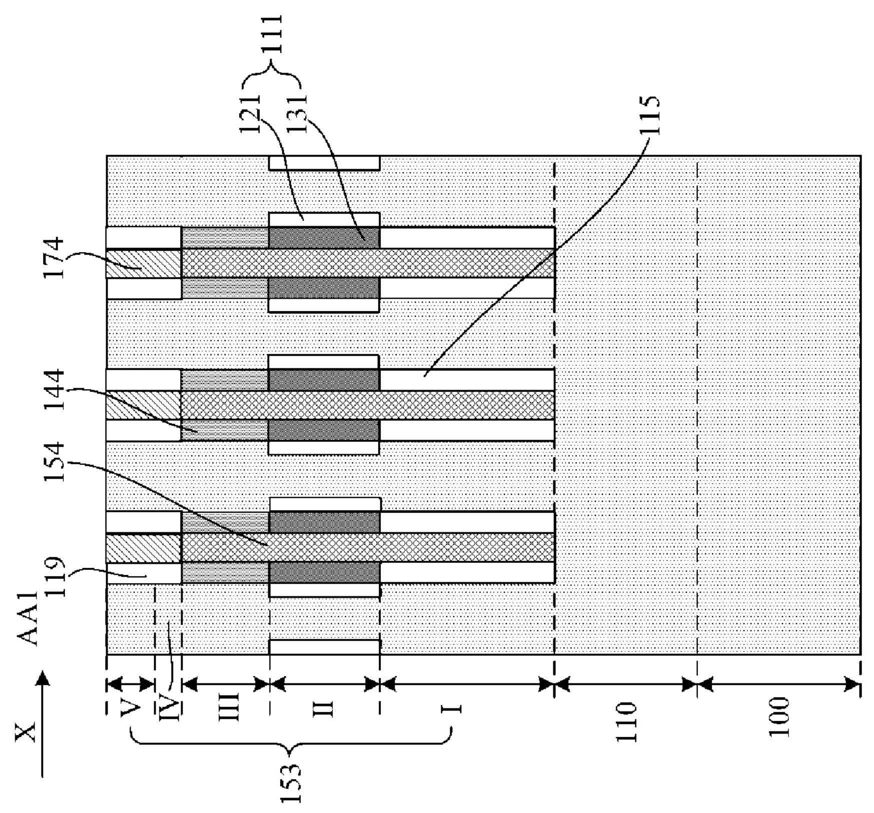

Referring to FIG. 14, a fifth isolation layer 174 filling the fifth gap i is formed.

Figure 15:
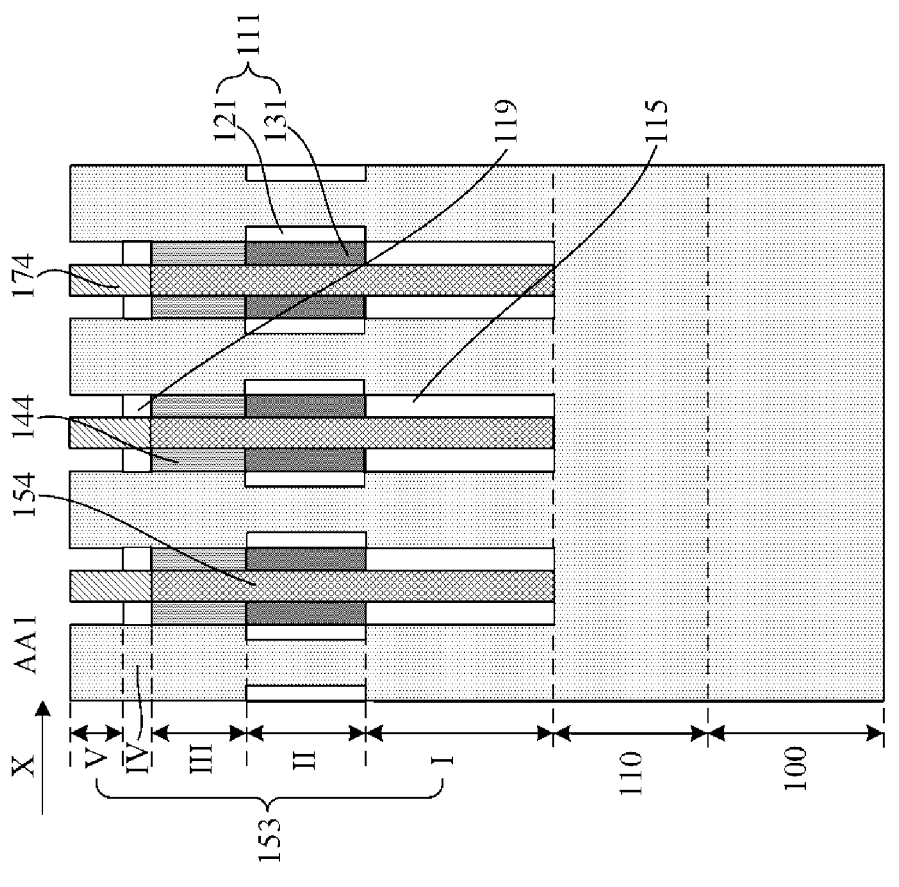
Figure 16:
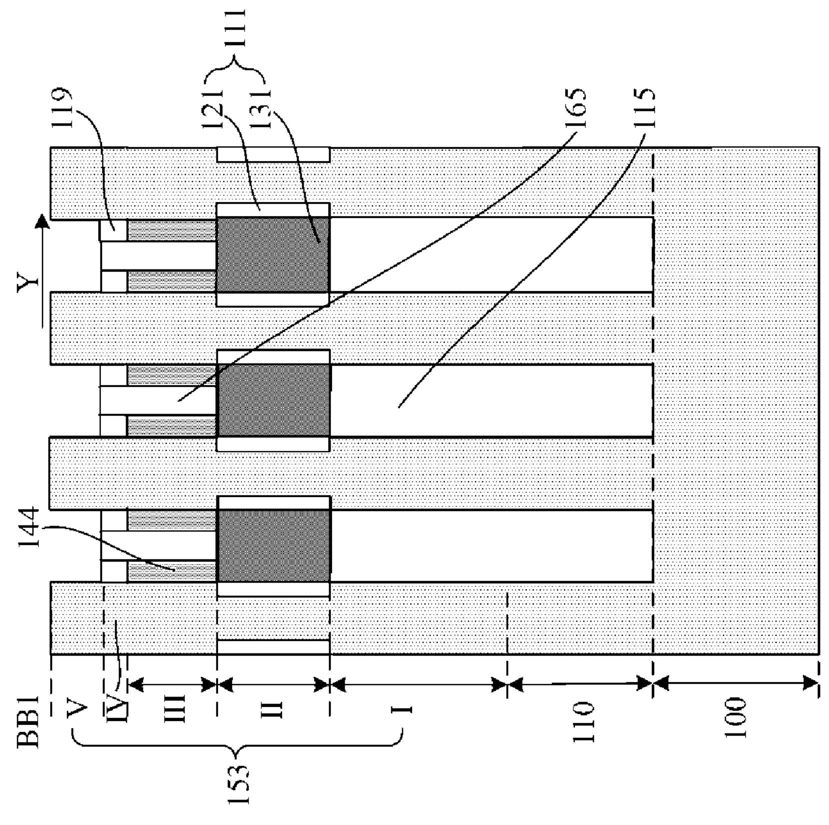

Referring to FIG. 15 and FIG. 16, the second sacrificial layer 119 and the initial second insulating layer 165 are etched with the fifth isolation layer 174 and the semiconductor column 103 as a mask, and the remaining second sacrificial layer 119 only surrounds the first sidewall of the fourth region IV extends along the third direction Z, and the remaining initial second insulating layer 165 is located between the adjacent fourth isolation layers 144 along the second direction Y, and is located between the adjacent fourth isolation layers 144 along the second direction Y. between the two sacrificial layers 119. In some embodiments, the material of the second sacrificial layer 119 and the material of the initial second insulating layer 165 may be the same, and the second sacrificial layer 119 and the initial second insulating layer 165 may be etched simultaneously through the same etching process. In practical applications, the material of the second sacrificial layer 119 may also be different from that of the initial second insulating layer 165, and the material of the second sacrificial layer 119 and the initial second insulating layer 165 are respectively etched by different etching processes.

Figure 17:
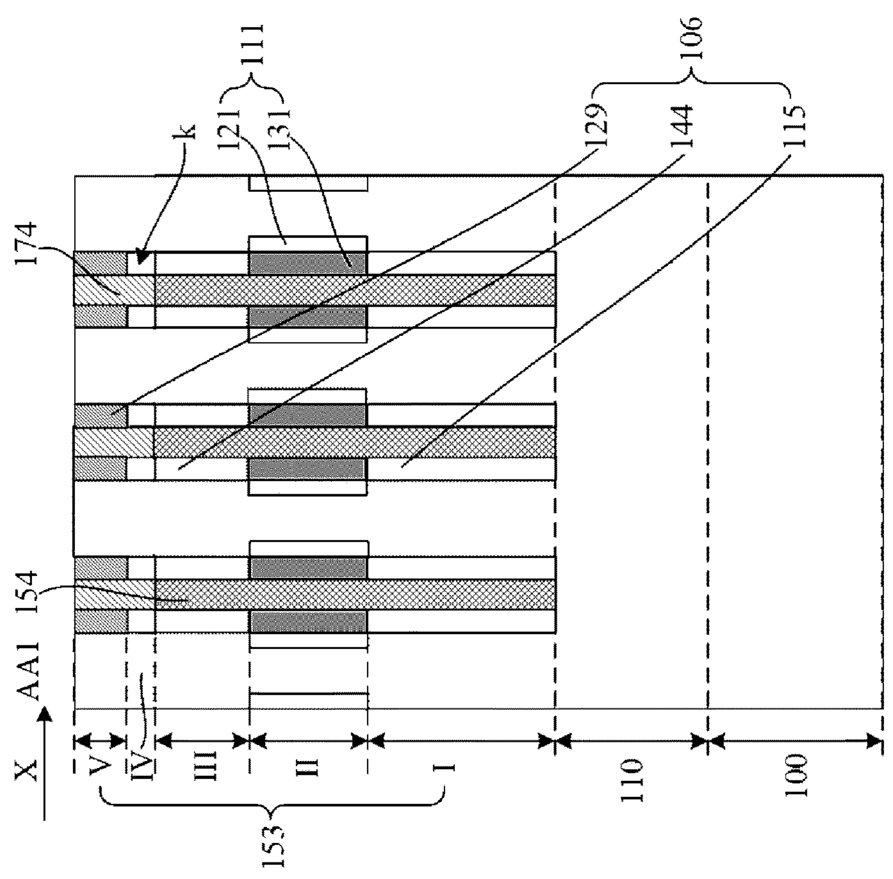
Figure 18:
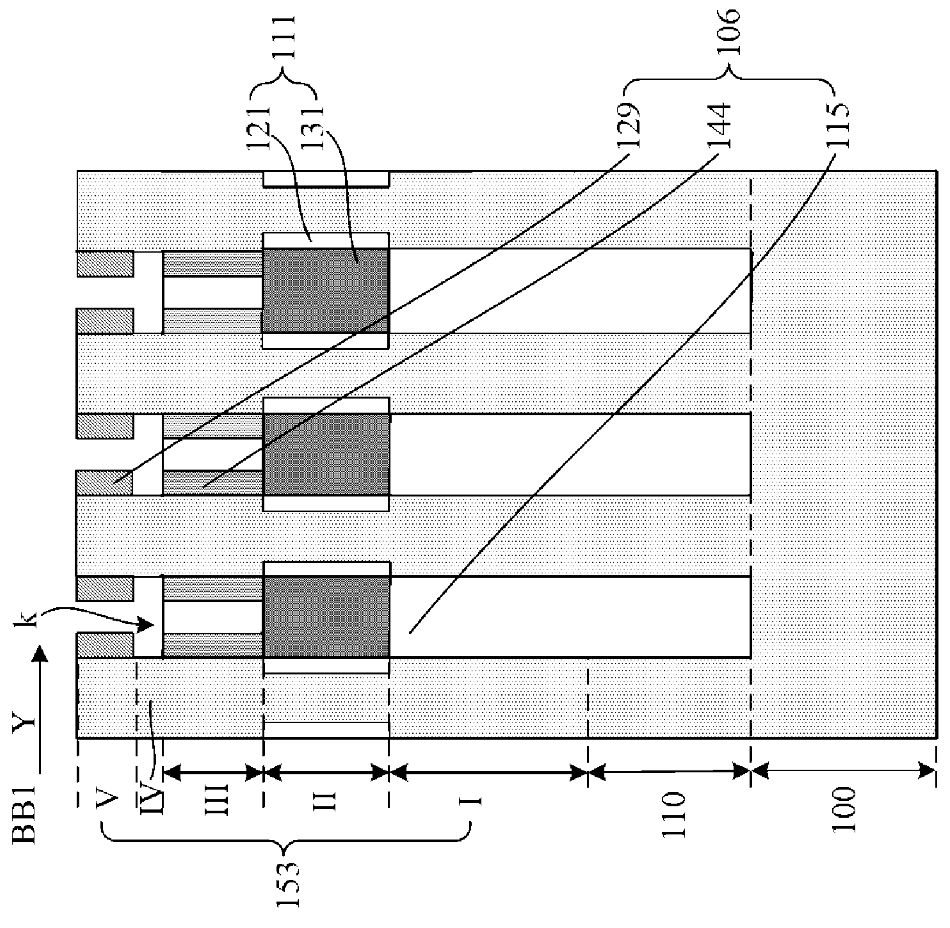

Referring to FIGS. 17 to 18, a third sacrificial layer 129 is formed, the third sacrificial layer 129 surrounds the sidewall of the fifth region V extending along the third direction Z, and the third sacrificial layer 129 is in contact with the fifth isolation layer 174; using the third sacrificial layer 129, the semiconductor column 103 and the fifth isolation layer 174 as a mask, removing the remaining second sacrificial layer 119, and removing the initial second insulating layer 165 between two adjacent second sacrificial layer 119 located along the second direction Y (refer to FIG. 16), and the remaining initial second insulating layer 165 is used as the second insulating layer 125 to form the protective layer 106 on the exposed sidewall of the fourth region IV which extends along the third direction Z and the sixth gaps k.

It can be understood that the protection layer 106 may include: a first insulating layer 115 surrounding the sidewall extending in the third direction Z of the first region I, and a first insulating layer 115 surrounding the sidewall extending in the third direction Z of the third region III. The fourth isolation layer 144, and the third sacrificial layer 129 surrounding the sidewall of the fifth region V extending along the third direction Z. In addition, in the step of etching the second sacrificial layer 119 and the initial second insulating layer 165, the third sacrificial layer 129 and the fifth isolation layer 174 may also serve as a supporting frame.

Figure 19:
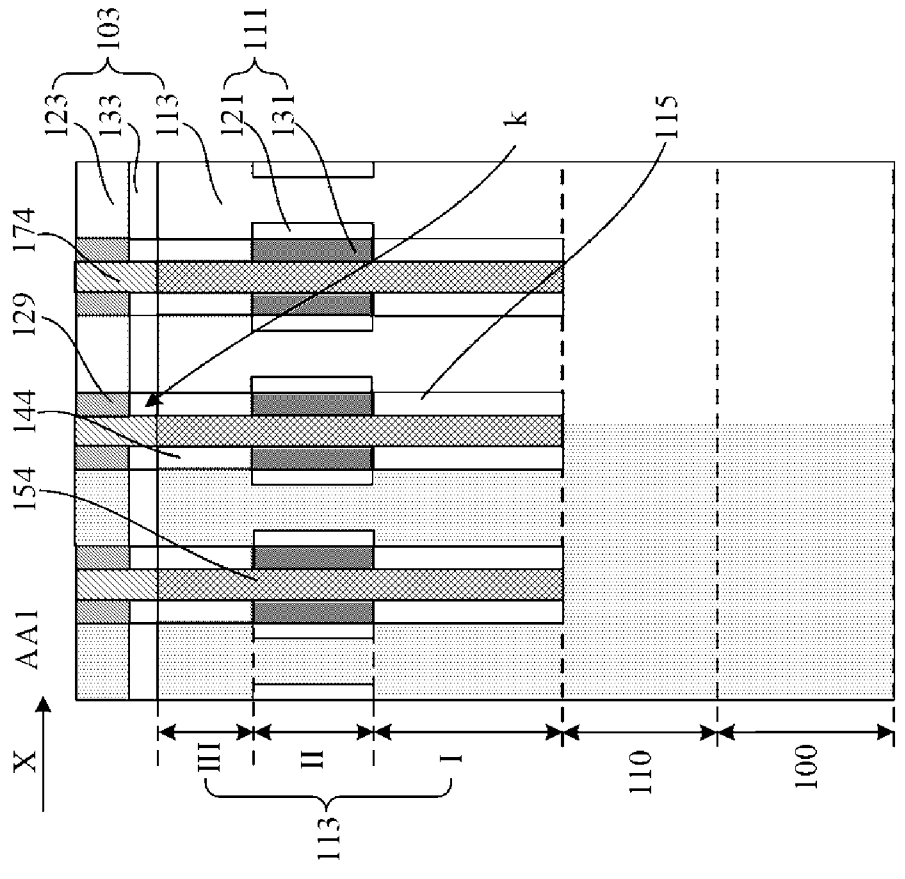
Figure 20:
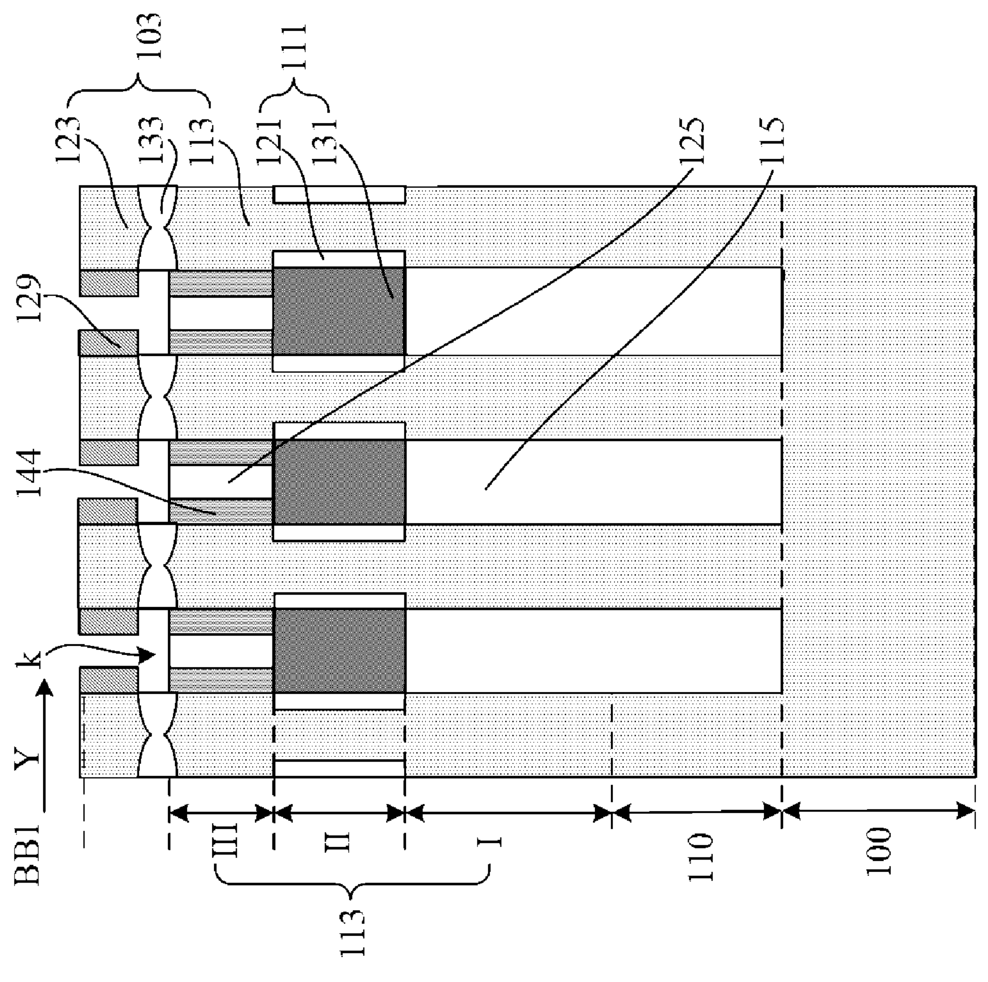

Referring to FIG. 19 to FIG. 20, the exposed sidewall of the fourth region IV is oxidized to convert the fourth region IV into an isolation structure 133, leaving the initial semiconductor column 153 as the semiconductor column 103; the semiconductor column 103 on the side of the structure 133 close to the data line 110 is the first semiconductor column 113, the semiconductor column 103 on the side of the isolation structure 133 away from the data line 110 is the second semiconductor column 123, the first region I, the second region II and the third region III forms the first semiconductor column 113, and the fifth region V serves as the second semiconductor column 123.

In some embodiments, oxidizing the exposed sidewall of the fourth zone IV includes: performing an in-situ steam generation process (ISSG) on the exposed sidewall of the fourth zone IV. The in-situ water vapor generation process is a process for growing an oxide layer through a high-temperature water vapor atmosphere, and the growth rate of the oxide layer is relatively fast. The oxide layer obtained by oxidation has better electrical properties.

In some embodiments, referring to FIGS. 21 to 26, after forming the isolation structure 133, the step of forming the second transistor 102 may include: forming the first conductive layer 112, the dielectric layer 132 and the second conductive layer 122; the first conductive layer 112 is located on part of the sidewall of the second semiconductor column 123 extending along the third direction Z, the second conductive layer 122 is located on the top surface of the second semiconductor column 123 away from the data line 110, and the dielectric layer 132 is located on the first conductive layer. 112 and the second semiconductor column 123, and between the second conductive layer 122 and the second semiconductor column 123.

In some embodiments, forming the dielectric layer 132 on the surface of the exposed second semiconductor column 123 includes: performing oxidation treatment on the exposed second semiconductor column 123, so as to form a dielectric layer 132 on the surface of the remaining second semiconductor column 123. In some embodiments, the exposed second semiconductor columns 123 may be oxidized by an in-situ water vapor generation process.

Figure 21:
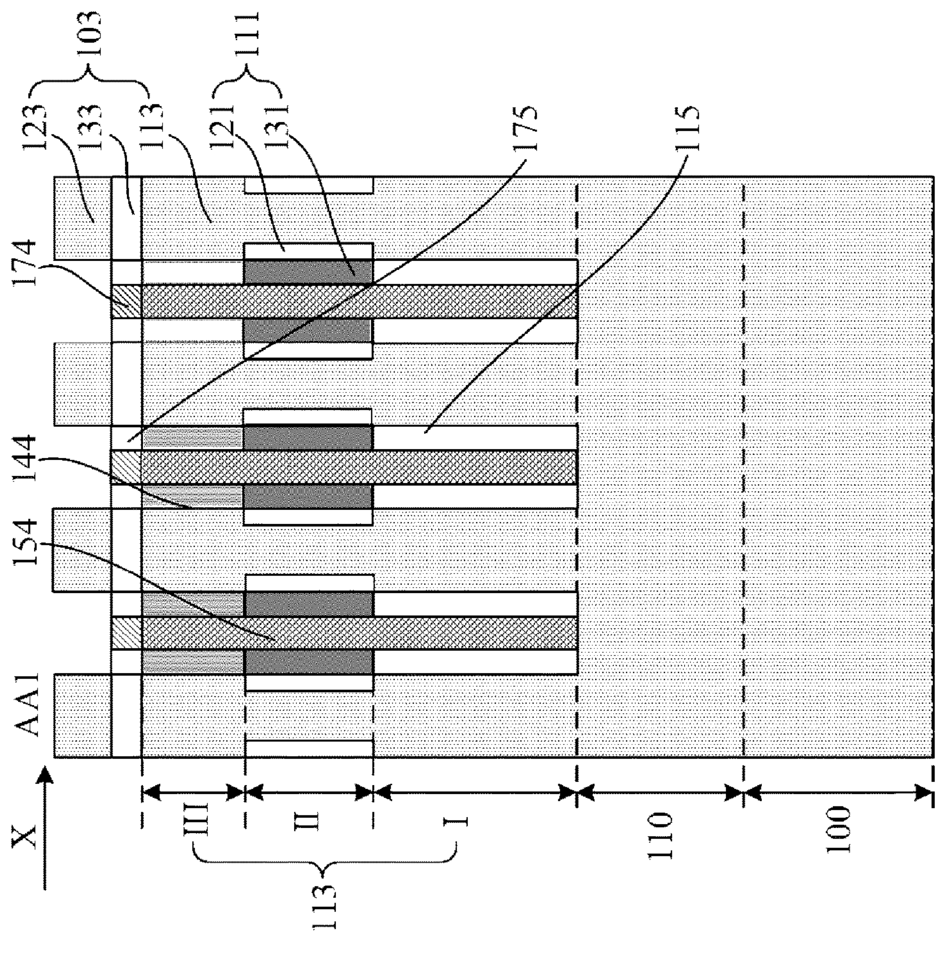
Figure 22:
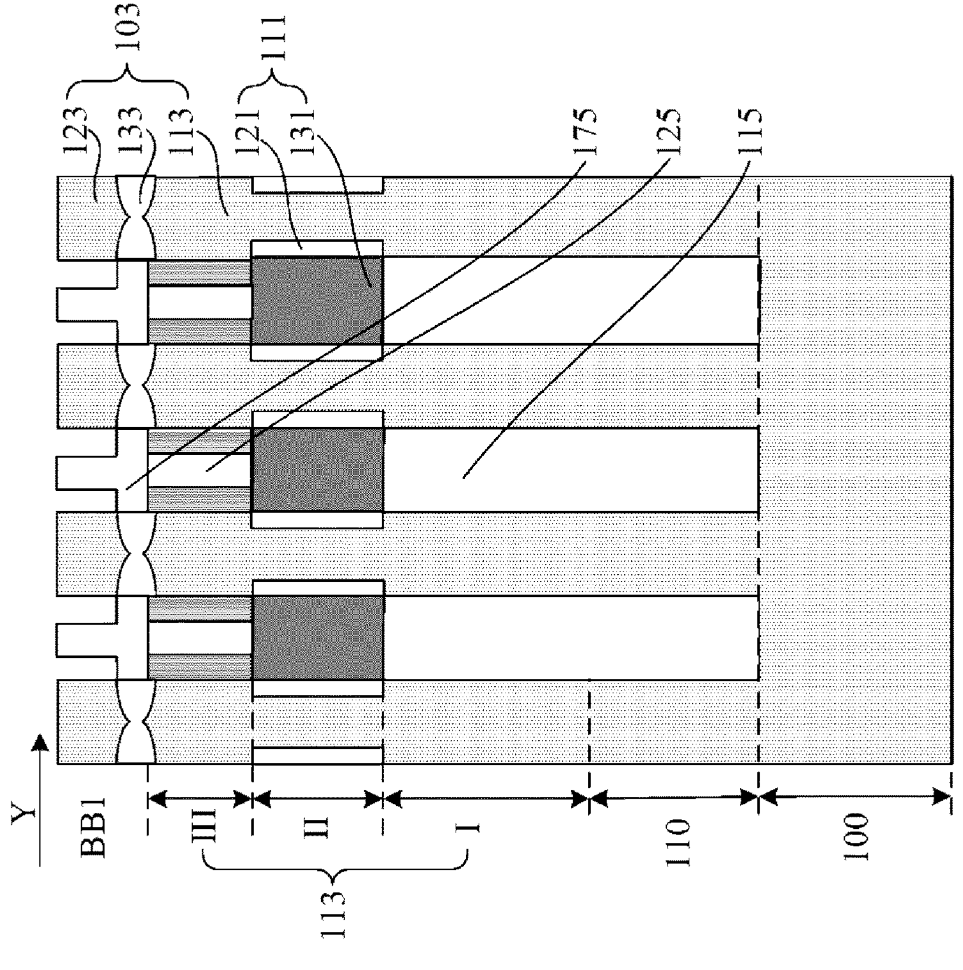

In some embodiments, forming the dielectric layer 132 may include the following steps:

Referring to FIGS. 21 to 22, part of the protective layer 106 of the sidewall of the second semiconductor column 123 extending along the third direction Z is removed to expose part of the sidewall of the second semiconductor column 123 extending along the third direction Z, and expose the side of the second semiconductor column 123 away from the isolation structure 133.

In some embodiments, before removing part of the protective layer 106 on the sidewall of the second semiconductor column 123 extending along the third direction Z, it further includes: referring to FIGS. 21 to 22, forming a initial third insulating layer 175 is the basis for the subsequent formation of the third insulating layer 135.

Continuing to refer to FIGS. 21 to 22, the step of removing part of the protective layer 106 on the sidewalls of the second semiconductor columns 123 extending along the third direction Z includes: removing the sidewalls extending along the third direction Z surrounding the fifth region V, the third sacrificial layer 129 of the wall, and the fifth isolation layer 174 between the adjacent third sacrificial layers 129 along the first direction X is removed, and the remaining fifth isolation layer 174 is located between the adjacent third sacrificial layers 129 along the first direction X. Between the initial third insulating layer 175, it can be understood that, in the structure shown in FIG. 21, the fifth isolation layer 174 and the initial third isolation layer 154 together constitute the third isolation layer 134 (refer to FIG. 1).

Figure 23:
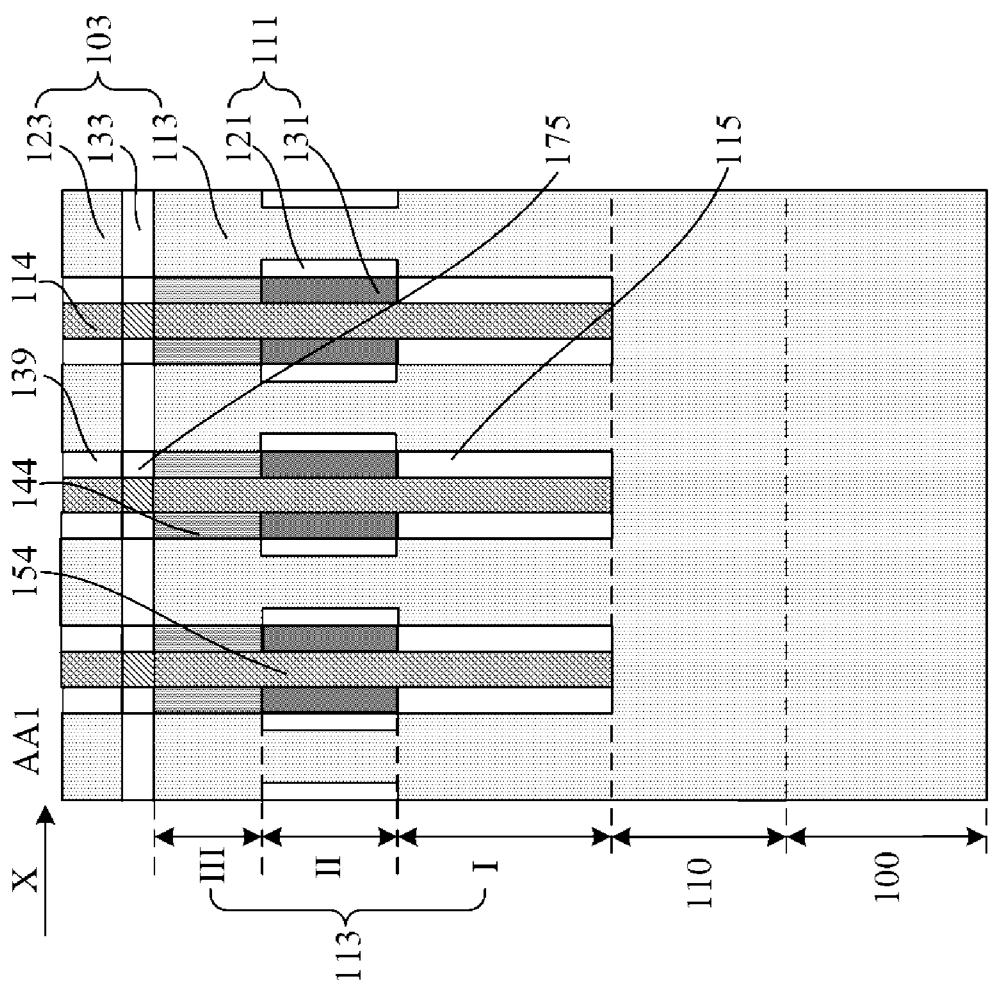
Figure 24:
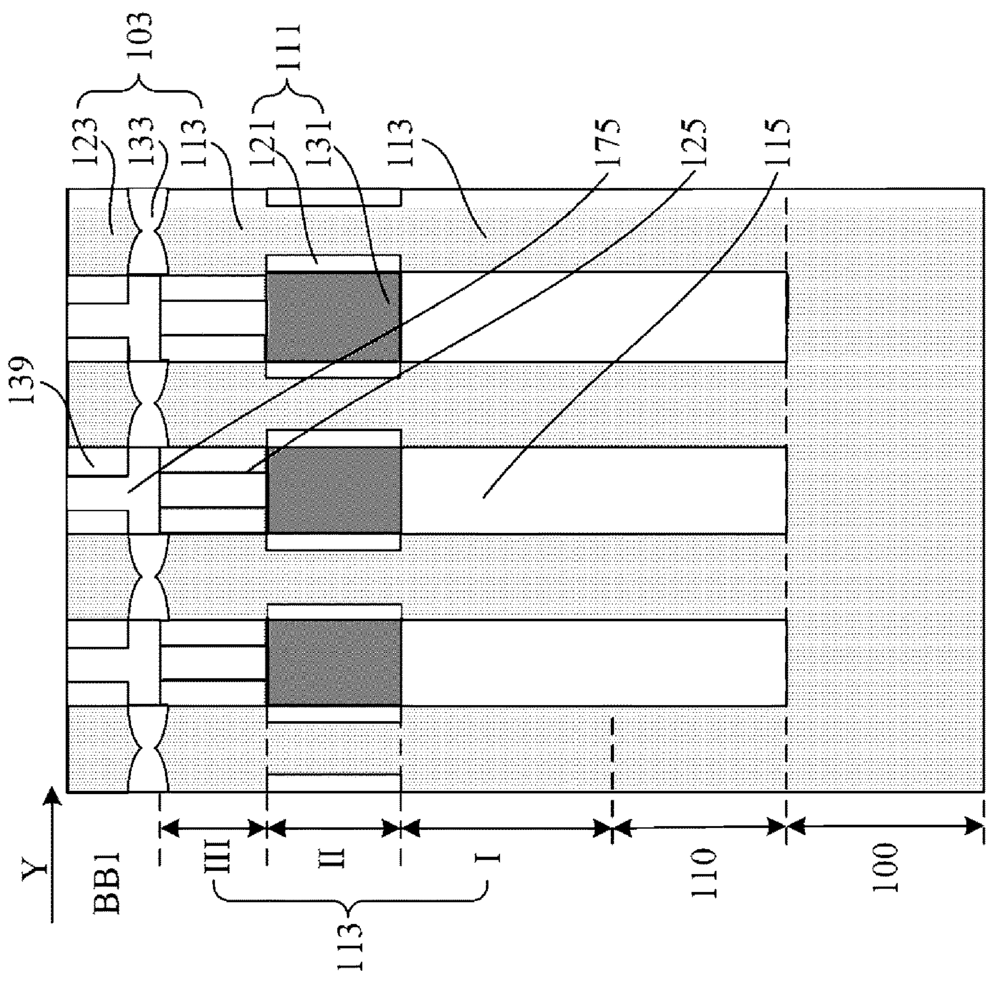

Referring to FIG. 23 to FIG. 24, a fourth sacrificial layer 139 is formed, the fourth sacrificial layer 139 is located on the sidewall of the fifth region V extending along the third direction Z, and the fourth sacrificial layer 139 and the initial third insulating layer 175 contact connection, the seventh gap between adjacent fourth sacrificial layers 139 along the first direction; continue referring to FIG. 23 to FIG. 24, forming the first isolation layer 114 filling the seventh gap.

Figure 25:
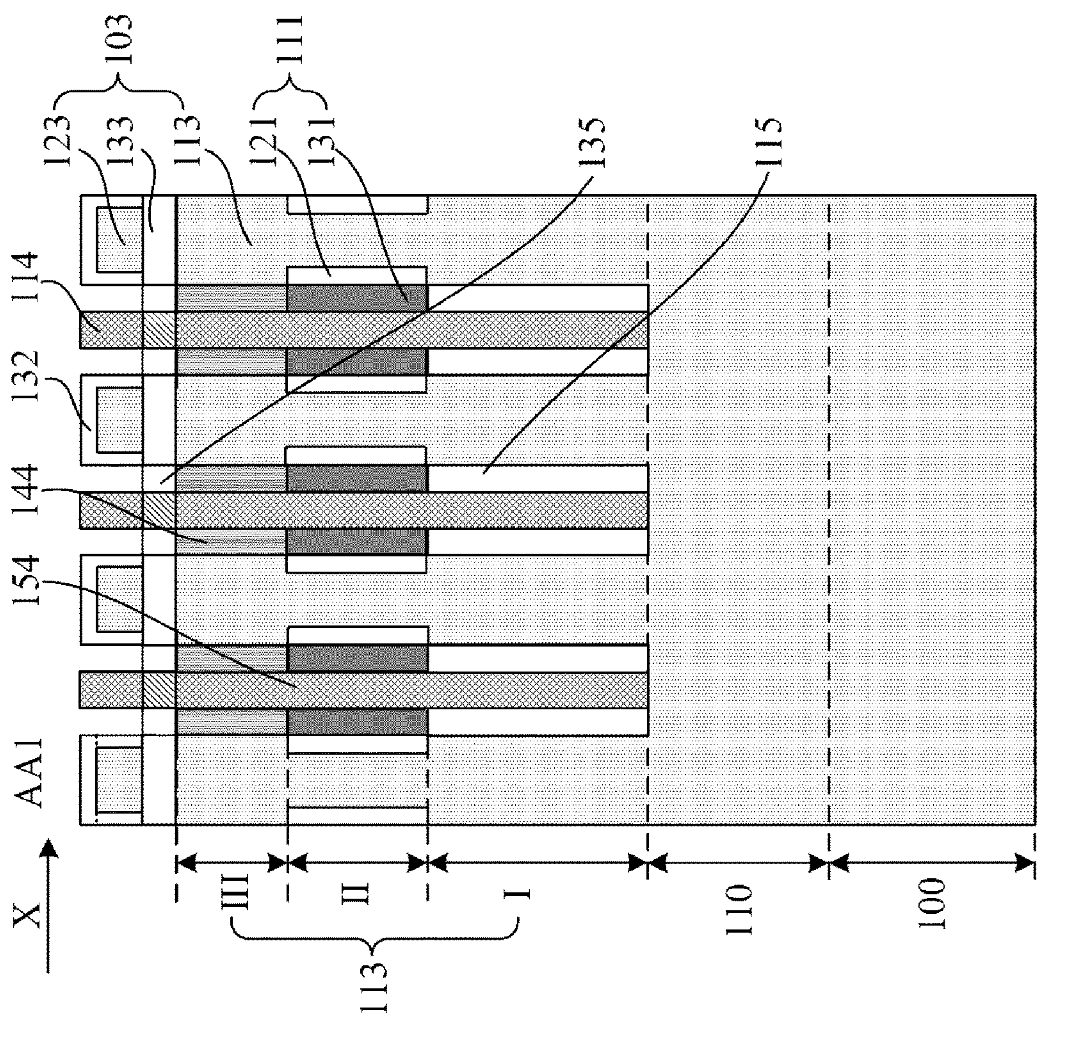
Figure 26:
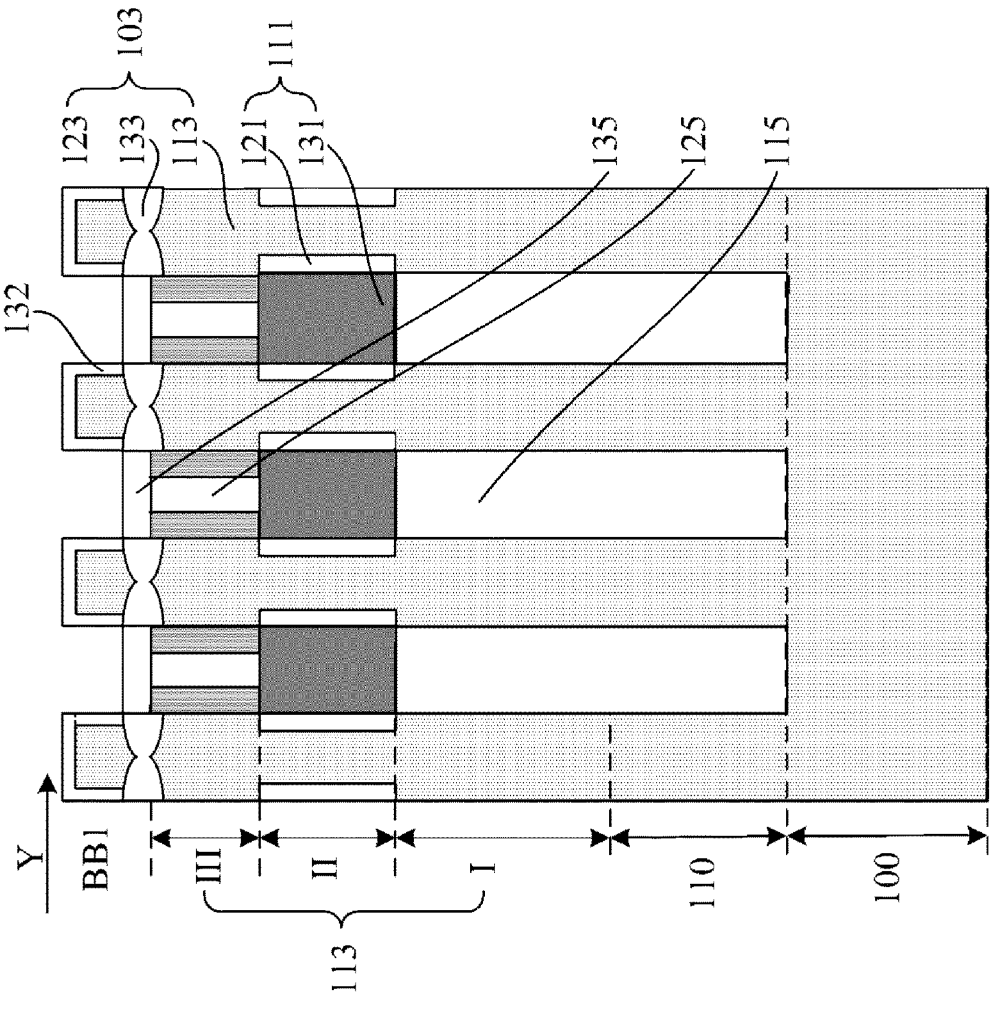

Referring to FIG. 25 and FIG. 26, using the first isolation layer 114 and the second semiconductor column 123 as a mask, the fourth sacrificial layer 139 and part of the initial third insulating layer 175 (refer to FIG. 24) are removed, and the removed initial third insulating layer 175 are located between adjacent fourth sacrificial layers 139 along the second direction Y, and the original third insulating layer 175 remains as the third insulating layer 135.

Continuing to refer to FIG. 25 and FIG. 26, a dielectric layer 132 is formed on the exposed surface of the second semiconductor column 123. It should be noted that the dielectric layer 132 can be formed in the direction of oxidizing the exposed surface of the second semiconductor column 123, or can be formed by deposition process to form the dielectric layer 132 on the exposed surface of the second semiconductor column 123.

It should be noted that the dielectric layer 132 can be integrally formed, and the first conductive layer 112, the second isolation layer 124, and the second conductive layer 122 are subsequently formed on the basis of FIG. 25 and FIG. 26, In some other embodiments, the dielectric layer 132 can be formed in steps, and the step-by-step formation of the dielectric layer 132 will be described in detail below.

The second semiconductor column 123 is exposed except for the side surface in contact with the isolation structure 133, and the protective layer 106 is located on other surfaces of the second semiconductor column 123; after the second semiconductor column 123 is formed, the protective layer 106 is removed Previously, the method further includes: forming a first isolation layer 114 extending along the second direction Y, the first isolation layer 114 being located between adjacent second semiconductor columns 123 arranged at intervals along the first direction X. The method of forming the first isolation layer 114 has been described in the foregoing embodiments, and will not be repeated here.

Figure 27:
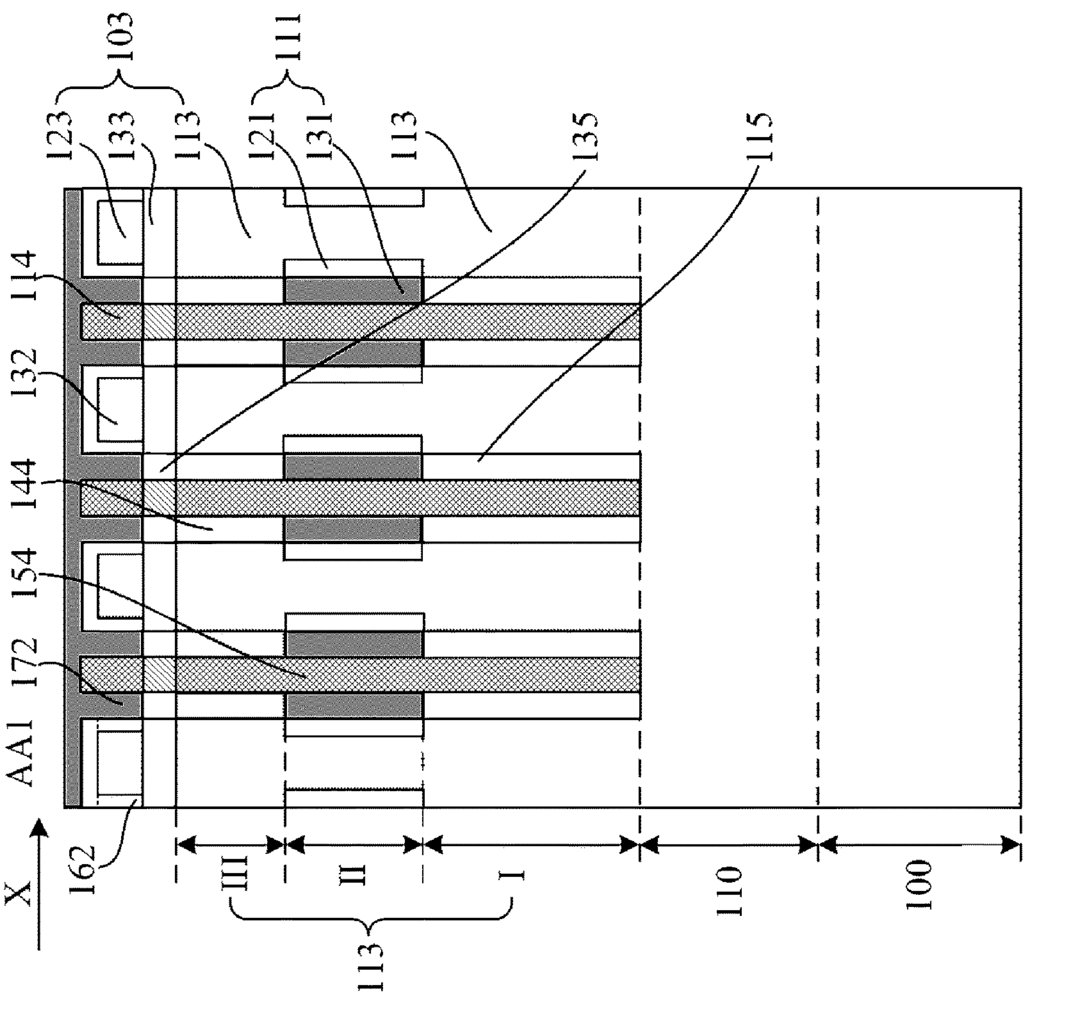

The dielectric layer 132 includes a first dielectric layer 142 and a second dielectric layer 152, the first dielectric layer 142 is located between the first conductive layer 112 and the second semiconductor column 123, and the second dielectric layer 152 is located in the second conductive layer 122 Between the second semiconductor column 123; forming the first dielectric layer 142, the first conductive layer 112 and the second dielectric layer 152 includes the following steps:

Referring to FIG. 27, an initial first dielectric layer 162 is formed on the surface of the exposed second semiconductor column 123, and the first isolation layer 114 and the initial first dielectric layer 162 form a first interval; an initial first dielectric layer 162 is formed in the first interval. A conductive layer 172, the initial first conductive layer 172 fills the first gap and is located on the side of the initial first dielectric layer 162 away from the second semiconductor column 123.

With reference to FIG. 27, FIG. 2 and FIG. 4, the initial first conductive layer 172 is etched back, and the remaining initial first conductive layer 172 is used as the first conductive layer 112. In the step of etching back, remove the second semiconductor column 123 far away from the initial first dielectric layer 162 on the top surface of the isolation structure, it should be noted that, the process of forming the initial first dielectric layer 162 and the second dielectric layer 152 can be one of ISSG or deposition process.

Continuing to refer to FIG. 2 and FIG. 4, the second conductive layer 122 is formed on the side of the second dielectric layer 152 away from the substrate 100, and the second conductive layer extends along the first direction X.

To sum up, in the semiconductor structure formed by the manufacturing method provided by another embodiment of the present disclosure, the first transistor 101 can be used as a dynamic memory selection transistor, and the second transistor 102 can be used as a structure for storing data, that is, as a capacitor structure. In this way, the storage or read operation of data can be realized through the first transistor 101 and the second transistor 102, and the first transistor 101 can be a GAA transistor, which is beneficial to improve the integration density of the semiconductor structure, and the second transistor 102 has a smaller size than the current capacitor structure, which is conducive to further reducing the overall size of the semiconductor structure. Moreover, the second transistor 102 has a higher resistance to current changes in the first transistor 101 than the current capacitor structure. The inductive sensitivity is conducive to realizing the storage or reading operation of data within a smaller range of current change, thereby helping to reduce the power consumption of the semiconductor structure when it is working.

Those of ordinary skill in the art can understand that the above-mentioned implementations are specific examples for realizing the disclosure, and in practical applications, various changes can be made to it in form and details without departing from the disclosure spirit and scope of the embodiments. Any person skilled in the art can make various changes and modifications without departing from the spirit and scope of the embodiments of the present disclosure. Therefore, the protection scope of the embodiments of the present disclosure should be based on the scope defined in the claims.

The invention claimed is:

1. A semiconductor structure, comprising:

a substrate and a data line on the substrate, wherein the data line extends along a first direction;

a first transistor on the data line and a second transistor on a side of the first transistor away from the data line;

wherein, the first transistor comprises a first semiconductor column, and the second transistor comprises a second semiconductor column, wherein the first semiconductor column and the second semiconductor column are disposed on a part of a top surface of the data line and extend along a third direction;

and an isolation structure disposed inside the first and second semiconductor columns;

wherein, a thickness of the isolation structure in a third direction is different in different regions along a second direction, wherein the isolation structure penetrates the first and second semiconductor columns, and wherein two of the first direction, the second direction and the third direction intersect.

2. The semiconductor structure of claim 1, wherein each of the first and second semiconductor columns has opposing first and second sides in the second direction, wherein along the first side points to inward of each of the first and second semiconductor columns, and along the second side points to the interior of the first and second semiconductor columns, and wherein a thickness of the isolation structure in the third direction gradually decreases.

3. The semiconductor structure according to claim 1, wherein the first semiconductor column is disposed on a side of the isolation structure close to the data line, and wherein the first transistor further comprises:

a gate structure located on a part of a sidewall extending along the second direction and surrounding the first semiconductor column.

4. The semiconductor structure according to claim 3, wherein the second semiconductor column is located on a side of the isolation structure away from the data line, and wherein the second transistor further comprises:

a first conductive layer disposed on a part of a sidewall of the second semiconductor column extending along the third direction;

a second conductive layer disposed on a top surface of the second semiconductor column away from the data line;

a dielectric layer disposed between the first conductive layer and the second semiconductor column, and between the second conductive layer and the second semiconductor column.

5. The semiconductor structure as claimed in claim 4, wherein if the second transistor is in an on state, the second semiconductor directly opposite to the first conductive layer and directly opposite to the second conductive layer constitutes a channel region of the second transistor, and the first conductive layer, the second conductive layer, and the channel region constitute a transmission path of an on-current of the second transistor.

6. The semiconductor structure according to claim 4, wherein the second transistor comprises a single electron transistor.

7. The semiconductor structure according to claim 6, wherein the dielectric layer comprises a first dielectric layer and a second dielectric layer, wherein the first dielectric layer is dispose between the first conductive layer and the second semiconductor column, wherein the second dielectric layer is disposed between the second conductive layer and the second semiconductor column; wherein along the third direction, the thickness of the isolation structure is a first thickness, a thickness of the second dielectric layer is a second thickness, along the second direction, a thickness of the first dielectric layer is a third thickness, wherein the first thickness is greater than the second thickness, and the first thickness is greater than the third thickness.

8. The semiconductor structure of claim 7, wherein the second thickness is equal to the third thickness.

9. The semiconductor structure according to claim 4, wherein the dielectric layer surrounds sidewalls of the second semiconductor columns extending along the third direction; wherein the first conductive layer extends along the second direction; and wherein the first conductive layer relates to more than one of the second semiconductor column arranged at intervals along the second direction.

10. The semiconductor structure according to claim 4, wherein the second conductive layer extends along the first direction, and the second conductive layer relates to more than one of the first semiconductor column arranged at intervals along the first direction.

11. The semiconductor structure according to claim 4, wherein, along the third direction, the different regions of the first semiconductor column comprises a first region, a second region and a third region arranged in sequence;

wherein the first region is contact-connected to the data line, wherein the gate structure surrounds sidewall of the second region extending along the third direction, and wherein the third region is contact-connected to the isolation structure; and wherein an orthographic projection of the third region on the substrate is a first orthographic projection, an orthographic projection of the second semiconductor column on the substrate is a second orthographic projection, and wherein the second orthographic projection is located on the first orthographic projection.

12. The semiconductor structure according to claim 11, wherein the gate structure comprises:

a gate dielectric layer extending along the second direction and surrounding a part of a sidewall of the first semiconductor column;

a gate, wherein the gate surrounds a side of the gate dielectric layer away from the second semiconductor column;

wherein along the second direction, a thickness of the gate dielectric layer is a fourth thickness, the thickness of the dielectric layer located between the first conductive layer and the second semiconductor column is a fifth thickness, wherein the fourth thickness is greater than the fifth thickness.

13. A read and write control method for the semiconductor structure according to claim 1, comprising:

providing the semiconductor structure, wherein the semiconductor structure comprises the first semiconductor column disposed on the side of the isolation structure close to the data line, and the second semiconductor column disposed on the side of the isolation structure away from the data line, and wherein a part of the first semiconductor column is in contact with the isolation structure at a storage node;

wherein the second transistor comprises: a first conductive layer disposed on the part of the sidewall of the second semiconductor column extending along the third direction; and a second conductive layer disposed on a side of the second semiconductor column away from the top surface of the data line;

turning on the first transistor to adjust a voltage at the storage node to implement a write operation to the storage node;

wherein a magnitude of a voltage at the storage node determines a conductivity of the second semiconductor column;

applying a first voltage to one of the first conductive layer and the second conductive layer; and detecting a second voltage at another of the first conductive layer and the second conductive layer which the first voltage is not applied to, and the conductivity of the second semiconductor column is determined by a difference between the second voltage and the first voltage, wherein the conductivity of the second semiconductor column determines the voltage at the storage node, so as to realize the read operation on the storage node.

14. The read and write control method according to claim 13, wherein, along the third direction, the first transistor comprises a first region, a second region and a third region arranged in sequence, and a gate structure surrounding a sidewall of the second region extending along the third direction, wherein the first region is contact-connected to the data line, the third region is contact-connected to the isolation structure, and the third region is the storage node;

wherein performing write operation to the storage node comprises:

applying a third voltage to the data line and applying a fourth voltage to the gate structure to conduct a transmission between the first region and the third region, and to implement the write operation to the third region, wherein a voltage at the third region is controlled by a voltage on the data line.

15. A method of fabricating a semiconductor structure, comprising:

providing an initial substrate;

forming a data line and a first transistor in the initial substrate, wherein the data line extends along a first direction, wherein one end of the first transistor is connected to the data line, and wherein the initial substrate is a substrate;

forming a second transistor on a side of the first transistor away from the data line;

wherein the first transistor comprises a first semiconductor column, and the second transistor comprises a second semiconductor column, wherein the first semiconductor column is disposed on a part of a top surface of the data line and extends along a third direction;

forming an isolation structure inside the first semiconductor column, along a second direction, a thickness of the isolation structure in each of different regions of the third direction is different, and wherein the isolation structure penetrates the first and second semiconductor columns, wherein two of the first direction, the second direction and the third direction intersect.

16. The method of fabricating the semiconductor structure according to claim 15, wherein forming the data line and the first transistor in the initial substrate comprises:

patterning the data lines on the initial substrate, wherein the data lines extend along the first direction and spaced at intervals along the second direction;

forming initial first and second semiconductor columns on a part of the top surface of the data line, and forming a substrate with the remaining initial substrate;

forming a gate structure, wherein the gate structure extends along the second direction and surrounds part of sidewalls of the initial first and second semiconductor columns, wherein the part of the initial first semiconductor column and the gate structure constitute the first transistor.

17. The method of fabricating the semiconductor structure according to claim 16, wherein, along the third direction, the initial first and second semiconductor columns comprise a first region, a second region, a third region, a fourth region and a fifth region arranged in sequence; wherein the gate structure surrounds a sidewall of the second region extending along the third direction;

wherein steps of forming the isolation structure comprises:

forming a protective layer on the sidewall of the first region extending along the third direction, the third region and the fifth region, exposing only a sidewall of the fourth region extending along the third direction; and performing oxidation treatment on the exposed sidewall of the fourth region, to convert the fourth region into the isolation structure, and forming the first and second semiconductor columns from the first and second initial semiconductor columns;

wherein the first semiconductor column is located on a side of the isolation structure close to the data line, and wherein the second semiconductor column located on a side of the isolation structure away from the data line, and wherein the first region, the second region and the third region constitute the first semiconductor column, and the fifth region serves as the second semiconductor column.

18. The method of fabricating the semiconductor structure according to claim 17, wherein performing the oxidation treatment on the exposed sidewall of the fourth region comprises:

performing an in-situ water vapor generation process on the exposed sidewall of the fourth region.

19. The method of fabricating the semiconductor structure according to claim 17, wherein, after forming the isolation structure, the step of forming the second transistor comprises:

forming a first conductive layer, a dielectric layer and a second conductive layer, wherein the first conductive layer is disposed on a part of a sidewall of the second semiconductor column extending along the third direction, wherein the second conductive layer is disposed on the first semiconductor columns far away from the top surface of the data line, and wherein the dielectric layer is disposed between the first conductive layer and the second semiconductor column, and between the second conductive layer and the second semiconductor column.

20. The method of fabricating the semiconductor structure according to claim 19, wherein a step of forming the dielectric layer comprises:

removing a part of the protective layer on the sidewall of the second semiconductor column extending along the third direction to expose the part of the sidewall of the second semiconductor column extending along the third direction, and exposing the side of the second semiconductor column away from the isolation structure;

forming the dielectric layer on the exposed surface of the second semiconductor column by oxidizing the exposed second semiconductor column to form the dielectric layer on the remaining surfaces of the second semiconductor column;

wherein the protective layer is disposed on other exposed surfaces of the second semiconductor columns, except a surface contacting with the isolation structure;

wherein after forming the second semiconductor column, before removing the protective layer, the method further comprises:

forming a first isolation layer extending along the second direction, wherein the first isolation layer is disposed between two adjacent second semiconductor columns arranged at intervals along the first direction;

wherein the dielectric layer comprises a first dielectric layer and a second dielectric layer, wherein the first dielectric layer is disposed between the first conductive layer and the second semiconductor column the second dielectric layer is disposed between the second conductive layer and the second semiconductor column;

wherein steps of forming the first dielectric layer, the first conductive layer and the second dielectric layer comprise:

forming an initial first dielectric layer on the exposed surface of the second semiconductor column, and forming a first interval between the first isolation layer and the initial first dielectric layer;

forming an initial first conductive layer in the first interval, wherein the initial first conductive layer fills the first interval and is disposed on a side of the initial first dielectric layer away from the second semiconductor column;

etching back the initial first conductive layer, forming the first conductive layer from the initial first conductive layer, wherein during the etching back, removing the initial first dielectric layer, forming the first dielectric layer from the initial first dielectric layer, and exposing a part of the sidewall of the first dielectric layer extending along the third direction;

forming a second isolation layer, wherein the second isolation layer and the first conductive layer jointly fill the first interval; and forming the second dielectric layer on the top surface of the second semiconductor column away from the first dielectric layer.

* * * * *